United States Patent
Liaw

(10) Patent No.: US 12,382,622 B2
(45) Date of Patent: Aug. 5, 2025

(54) MEMORY STRUCTURE

(71) Applicant: Taiwan Semiconductor Manufacturing Company, Ltd., Hsinchu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 574 days.

(21) Appl. No.: 17/815,285

(22) Filed: Jul. 27, 2022

(65) Prior Publication Data

US 2024/0040763 A1     Feb. 1, 2024

(51) Int. Cl.
   *H10B 10/00*     (2023.01)

(52) U.S. Cl.
   CPC ................... *H10B 10/125* (2023.02)

(58) Field of Classification Search
   CPC ............. H10B 10/125; H10D 30/6735; H10D 30/6757; H10D 89/10; H10D 30/43; H10D 62/121; H10D 64/251; B82Y 10/00
   See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,521,676 B2 * | 12/2022 | Chiu | H10D 89/10 |
| 11,527,539 B2 * | 12/2022 | Hsu | G11C 7/12 |
| 11,552,084 B2 * | 1/2023 | Wang | H10D 30/6713 |

* cited by examiner

*Primary Examiner* — Allison Bernstein
(74) *Attorney, Agent, or Firm* — Cooper Legal Group, LLC

(57) ABSTRACT

A memory structure includes a static random-access memory (SRAM) cell having a cell boundary. The SRAM cell includes a first write-port pull-up (PU) transistor and a second write-port PU transistor, a first write-port pull-down (PD) transistor, a second write-port PD transistor, a first write-port pass-gate (PG) transistor, a second write-port PG transistor, a first read-port PD transistor, a second read-port PD transistor, a first read-port PG transistor, and a second read-port PG transistor respectively including nanostructures that are vertically stacked from each other. The memory structure further includes a write bit-line conductor and a write bit-line-bar conductor in a first metal layer under the SRAM cell, wherein the write bit-line conductor is electrically connected to a source/drain feature of the first write-port pass-gate transistor and the write bit-line-bar conductor is electrically connected to a source/drain feature of the second write-port pass-gate transistor.

20 Claims, 24 Drawing Sheets

MEMORY STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) to reduce chip footprint while maintaining reasonable processing margins.

However, as GAA transistors and circuit cells continue to be scaled down, interconnection routing for memory cells uses too many routing resources and therefore impacts the cell scaling as well as memory performance. Accordingly, although existing technologies for fabricating memory cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
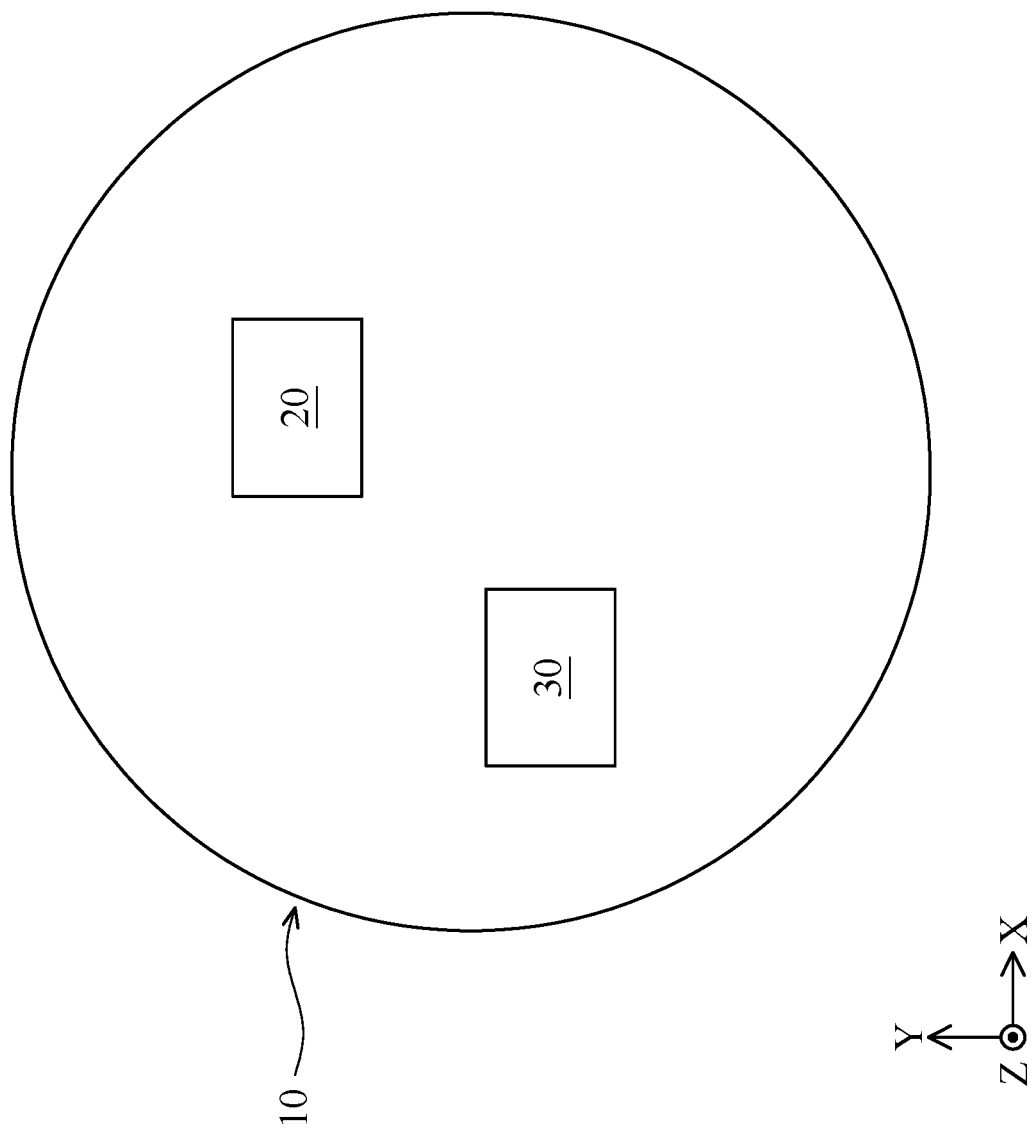
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to memory structures, and more particularly to a static random-access memory (SRAM) cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure also relates to layouts and structures thereof of memory devices. More particularly, the present disclosure relates to multiple-port SRAM cell layout designs and structures. The present disclosure provides a compact multiple-port SRAM cell design having a width of four gate pitches (the so-called four-gate-pitch SRAM cell) and with metal conductors (or tracks) on both a front-side and a backside of a substrate. Transistors such as gate-all-around (GAA) transistors forming the multiple-port SRAM cell are fabricated in a device region of the structure. Some of the metal conductors such as read bit-line conductors are fabricated on the front-side of the structure. Other metal conductors such as write bit-line conductor and write bit-line-bar (also referred to as complementary bit-line) conductor are fabricated on the back-side of the structure. The write bit-line conductor and write bit-line-bar conductor can be made wider than those metal conductors at the front-side, thereby reducing the resistance. The SRAM layout according to the present disclosure is process friendly and lithography friendly, enabling better process margin.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include a multiple-port SRAM cell constructed by ten GAA transistors with a write bit-line conductor and a write bit-line-bar conductor under the multiple-port SRAM cell (more specifically, functional transistors), that can improve cell performance and reduce the routing complexity of the multiple-port SRAM cell. The details of the present disclosure are described below in conjunction with the accompanying drawings, which illustrate the layout and structure of circuit cells, according to some embodiments.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, the IC chip 10 includes a memory region 20 and a logic region 30. The memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, the memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnection structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added to the IC chip 10, and some of the features described herein can be replaced, modified, or eliminated in other embodiments of the IC chip 10.

Figure 2:
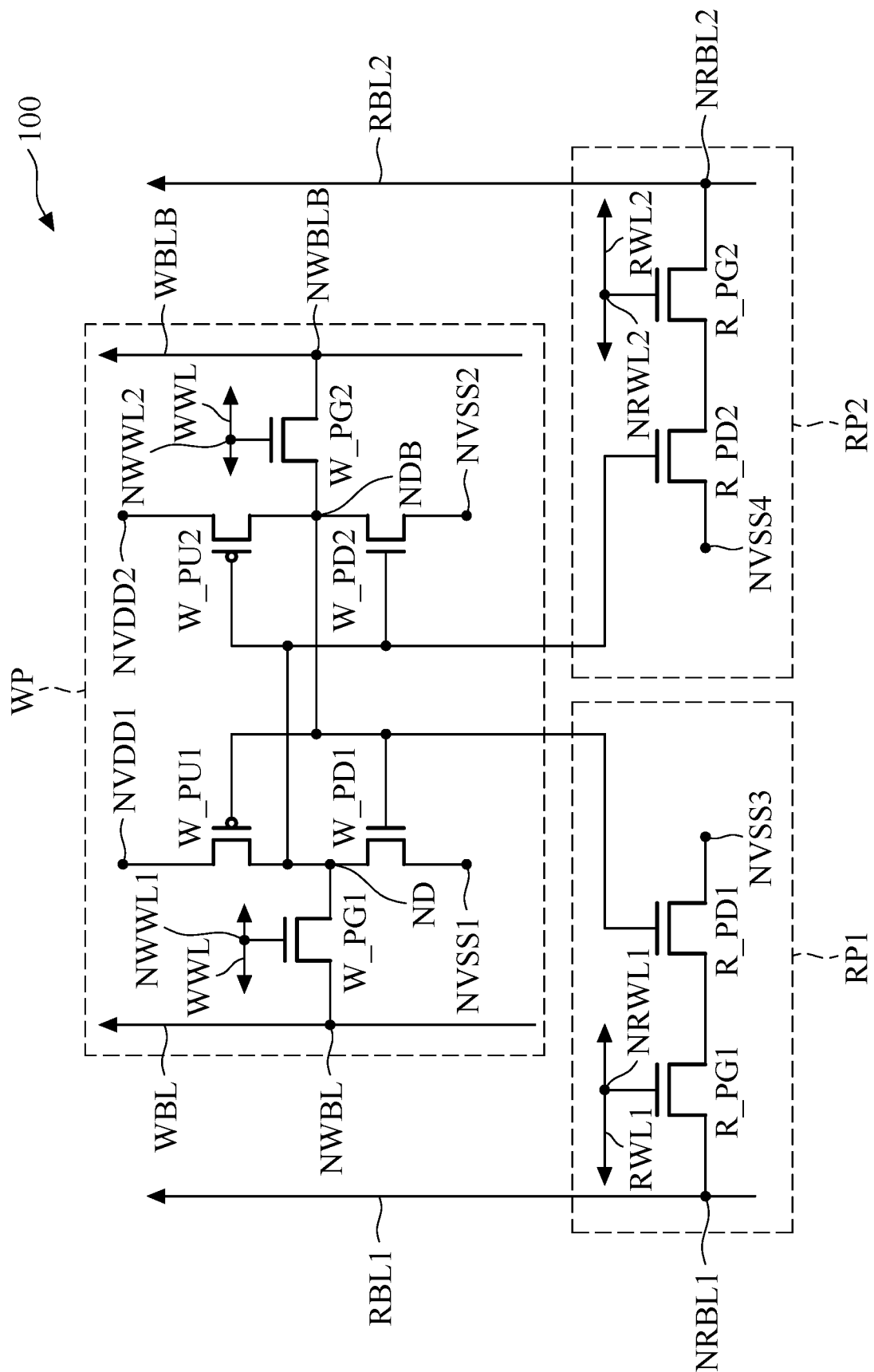
FIG. 2 is a circuit diagram for an SRAM cell that can be implemented in a memory region of FIG. 1, in accordance with some alternative embodiments of the present disclosure.

FIG. 2 is a circuit diagram for an SRAM cell 100 that can be implemented in the memory region 20 of FIG. 1, in accordance with some alternative embodiments of the present disclosure. The SRAM cell 100 includes a write-port circuit WP having data nodes ND and NDB, a first read-port circuit RP1 coupled with data node ND, and a second read-port circuit RP2 coupled with data node NDB. The SRAM cell 100 may also be referred to as three-port SRAM cell due to three-port of write-port circuit WP, first read-port circuit RP1, and the second read-port circuit RP2, as shown in FIG. 2.

The write-port circuit WP includes two p-type transistors, such as write-port pull-up (PU) transistors W_PU1 and W_PU2, and four n-type transistors, such as write-port pull-down (PD) transistors W_PD1 and W_PD2 and write-port pass-gate (PG) transistors W_PG1 and W_PG2. The write-port PU transistor W_PU1, the write-port PU transistor W_PU2, the write-port PD transistor W_PD1, and the write-port PD transistor W_PD2 form a cross latch having two cross-coupled inverters. The write-port PU transistor W_PU1 and the write-port PD transistor W_PD1 form a first inverter while the write-port PU transistor W_PU2 and the write-port PD transistor W_PD2 form a second inverter.

Drains of the write-port PU transistor W_PU1 and the write-port PD transistor W_PD1 are coupled together and form data node ND. Drains of the write-port PU transistor W_PU2 and the write-port PD transistor W_PD2 are coupled together and form data node NDB. Gates of the write-port PU transistor W_PU1 and the write-port PD transistor W_PD1 are coupled together and to drains of the write-port PU transistor W_PU2 and the write-port PD transistor W_PD2. Gates of the write-port PU transistor W_PU2 and the write-port PD transistor W_PD2 are coupled together and to drains of the write-port PU transistor W_PU1 and the write-port PD transistor W_PD1.

Source of write-port PU transistor W_PU1 is coupled with a supply voltage node NVDD1. Source of write-port PU transistor W_PU2 is coupled with a supply voltage node NVDD2. In some embodiments, supply voltage nodes NVDD1 and NVDD2 are electrically coupled together and configured to receive a supply voltage VDD. Source of the write-port PD transistor W_PD1 is coupled with a reference voltage node NVSS1, and source of the write-port PD transistor W_PD2 is coupled with a reference voltage node NVSS2. In some embodiments, reference voltage node NVSS1 and reference voltage node NVSS2 are electrically coupled together and configured to receive a reference voltage VSS.

The write-port pass-gate transistor W_PG1 functions as a pass gate between the data node ND and a write bit-line WBL, and the write-port pass-gate transistor W_PG2 functions as a pass gate between the data node NDB and a write bit-line-bar WBLB. A drain of the write-port pass-gate transistor W_PG1 is referred to as a write bit-line node NWBL and electrically coupled with the write bit-line WBL. A source of the write-port pass-gate transistor W_PG1 is electrically coupled with the data node ND. A drain of the write-port pass-gate transistor W_PG2 is referred to as a write bit-line-bar node NWBLB and electrically coupled with the write bit-line-bar WBLB. A source of the write-port pass-gate transistor W_PG2 is electrically coupled with the data node NDB. A gate of the write-port pass-gate transistor W_PG1 is referred to as a write word-line node NWWL1, a gate of the write-port pass-gate transistor W_PG2 is referred to as a write word-line node NWWL2, and write word-line nodes NWWL1 and NWWL2 are electrically coupled with a write word-line WWL.

In some embodiments, in a memory array having a plurality of memory cells each having a configuration the same as the SRAM cell 100, write bit-line-bars WBLB and write bit-lines WBL are coupled to each drain of the write-port pass-gate transistors W_PG1 and W_PG2 of memory cells in a column of the memory array, and write word-line WWL is coupled to each gate of the write-port pass-gate transistors W_PG1 and W_PG2 of memory cells in a row of the memory array.

In a write operation of the SRAM cell 100 using the write-port circuit WP, data to be written to the SRAM cell 100 is applied to the write bit-line WBL and the write bit-line-bar WBLB. The write word-line WWL is then activated to turn on the write-port pass-gate transistors W_PG1 and W_PG2. As a result, the data on the write bit-line WBL and the write bit-line-bar WBLB is transferred to and is stored in corresponding data nodes ND and NDB.

The read-port circuit RP1 includes two n-type transistors, such as read-port PD transistor R_PD1 and read-port PG transistor R_PG1. A source of the read-port PD transistor R_PD1 is coupled with a reference voltage node NVSS3. In some embodiments, the reference voltage node NVSS3 is configured to receive the reference voltage VSS. A gate of the read-port PD transistor R_PD1 is coupled with the data node NDB. A drain of the read-port PD transistor R_PD1 is coupled with a source of the read-port PG transistor R_PG1. A drain of the read-port PG transistor R_PG1 is referred to as a first read bit-line node NRBL1 and electrically coupled with a first read bit-line RBL1. A gate of the read-port PG transistor R_PG1 is referred to as a first read word-line node NRWL1 and electrically coupled with a first read word-line RWL1.

In a read operation of the SRAM cell 100 using the read-port circuit RP1, the read bit-line RBL1 is pre-charged with a high logical value. The read word-line RWL1 is activated with a high logical value to turn on the read-port PG transistor R_PG1. The data stored in data node NDB turns on or off the read-port PD transistor R_PD1. For example, if data node NDB stores a high logical value, the read-port PD transistor R_PD1 is turned on. The turned-on read-port PG transistor R_PG1 and the turned-on read-port PD transistor R_PD1 then pull read bit-line RBL1 to the reference voltage VSS or a low logical value at the source of the read-port PD transistor R_PD1. On the other hand, if the data node NDB stores a low logical value, the read-port PD transistor R_PD1 is turned off and operates as an open circuit. As a result, the read bit-line RBL1 remains at the pre-charged high logical value. Detecting a logical value on the read bit-line RBL1 therefore reveals the logical value stored in the data node NDB.

The read-port circuit RP2 includes two n-type transistors, such as read-port PD transistor R_PD2 and read-port PG transistor R_PG2. A source of the read-port PD transistor R_PD2 is coupled with a reference voltage node NVSS4. In some embodiments, reference the voltage node NVSS4 is configured to receive the reference voltage VSS. A gate of the read-port PD transistor R_PD2 is coupled with the data node ND. A drain of the read-port PD transistor R_PD2 is coupled with a source of the read-port PG transistor R_PG2. A drain of the read-port PG transistor R_PG2 is referred to as a second read bit-line node NRBL2 and electrically coupled with a second read bit-line RBL2. A gate of the read-port PG transistor R_PG2 is referred to as a second read word-line node NRWL2 and electrically coupled with a second read word-line RWL2.

A read operation of the SRAM cell 100 using the read-port circuit RP2 is performed in a manner similar to performing a read operation of the SRAM cell 100 using the read-port circuit RP1, and the detailed description thereof is thus omitted. As a result, if the data node ND stores a high logical value, the read bit-line RBL2 is pulled to the reference voltage VSS or a low logical value at the source of the read-port PD transistor R_PD2. On the other hand, if the data node ND stores a low logical value, the read bit-line RBL2 remains at the pre-charged high logical value. Detecting a logical value on the read bit-line RBL2 therefore reveals the logical value stored in the data node ND.

The SRAM cell 100 is illustrated as an example. In some embodiments, the present application is applicable to a multiple-port SRAM cell having one or more write ports and/or one or more read-ports. In some embodiments, the SRAM cell 100 shown in FIG. 2 has a total of ten transistors (including the write-port PU transistors W_PU1 and W_PU2, the write-port PD transistors W_PD1 and W_PD2, the write-port PG transistors W_PG1 and W_PG2, the read-port PD transistors R_PD1 and R_PD2, and the read-port PG transistors R_PG1 and R_PG2), such that the SRAM cell 100 may be referred to as 10 T SRAM cell.

Figure 3:
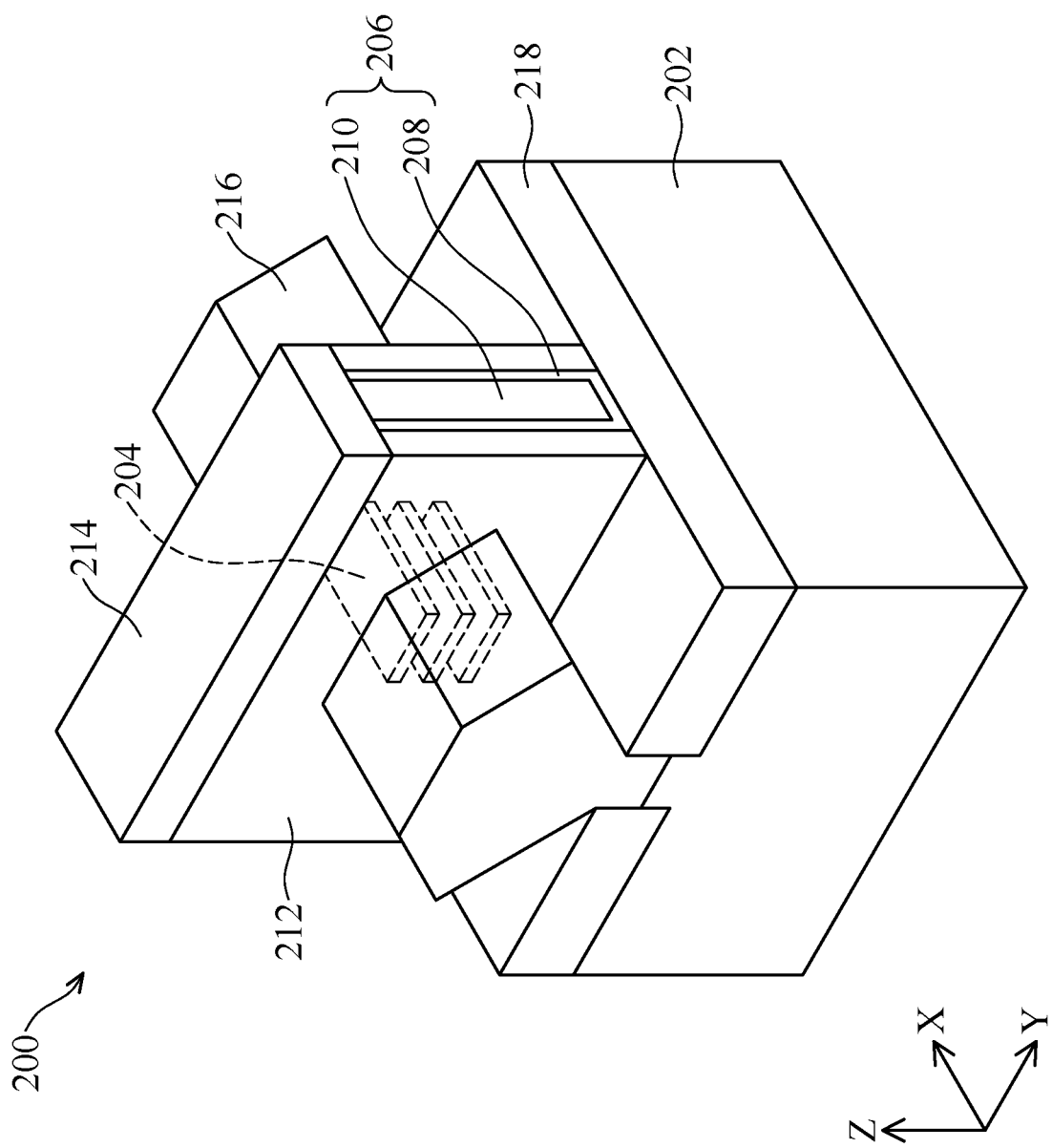
FIG. 3 is a perspective view of a GAA transistor in the SRAM cell, in accordance with some embodiments of the present disclosure.

The SRAM cell 100 discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si). In some embodiments, after the resultant GAA transistor 200 is formed, the substrate 202 may be removed by a suitable process (e.g., a chemical mechanical polishing (CMP) process) for forming back-side interconnection.

The GAA transistor 200 also includes one or more nanostructures 204 (dash lines) extending in an X-direction and vertically stacked (or arranged) in a Z-direction. More specifically, the nanostructures 204 are spaced apart from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 3, may refer to FIGS. 5F to 5J). As shown in FIG. 3, gate spacers 212 are on sidewalls of the gate structure 206 and over the nanostructures 204 (not shown in FIG. 3, may refer to FIGS. 5H and 5J). A gate top dielectric layer 214 is over the gate dielectric layer 208, the gate electrode 210, and the nanostructures 204. The gate top dielectric layer 214 is used for contact etch protection layer.

The GAA transistor 200 further includes source/drain features 216. As shown in FIG. 3, two source/drain features 216 are on opposite sides of the gate structure 206. The nanostructures 204 (dash lines) extends in the X-direction to connect one source/drain feature 216 to the other source/drain feature 216. The source/drain features 216 may also be referred to as source/drain, or source/drain regions. In some embodiments, source/drain feature(s) may refer to a source or a drain, individually or collectively dependent upon the context.

Isolation feature 218 is over the substrate 202 and under the gate dielectric layer 208, the gate electrode 210, and the gate spacers 212. The isolation feature 218 is used for isolating the GAA transistor 200 from other devices. In some embodiments, the isolation feature 218 may include different structures, such as shallow trench isolation (STI) structure, deep trench isolation (DTI) structure. Therefore, the isolation feature 218 is also referred as to a STI feature or DTI feature.

Figure 4:
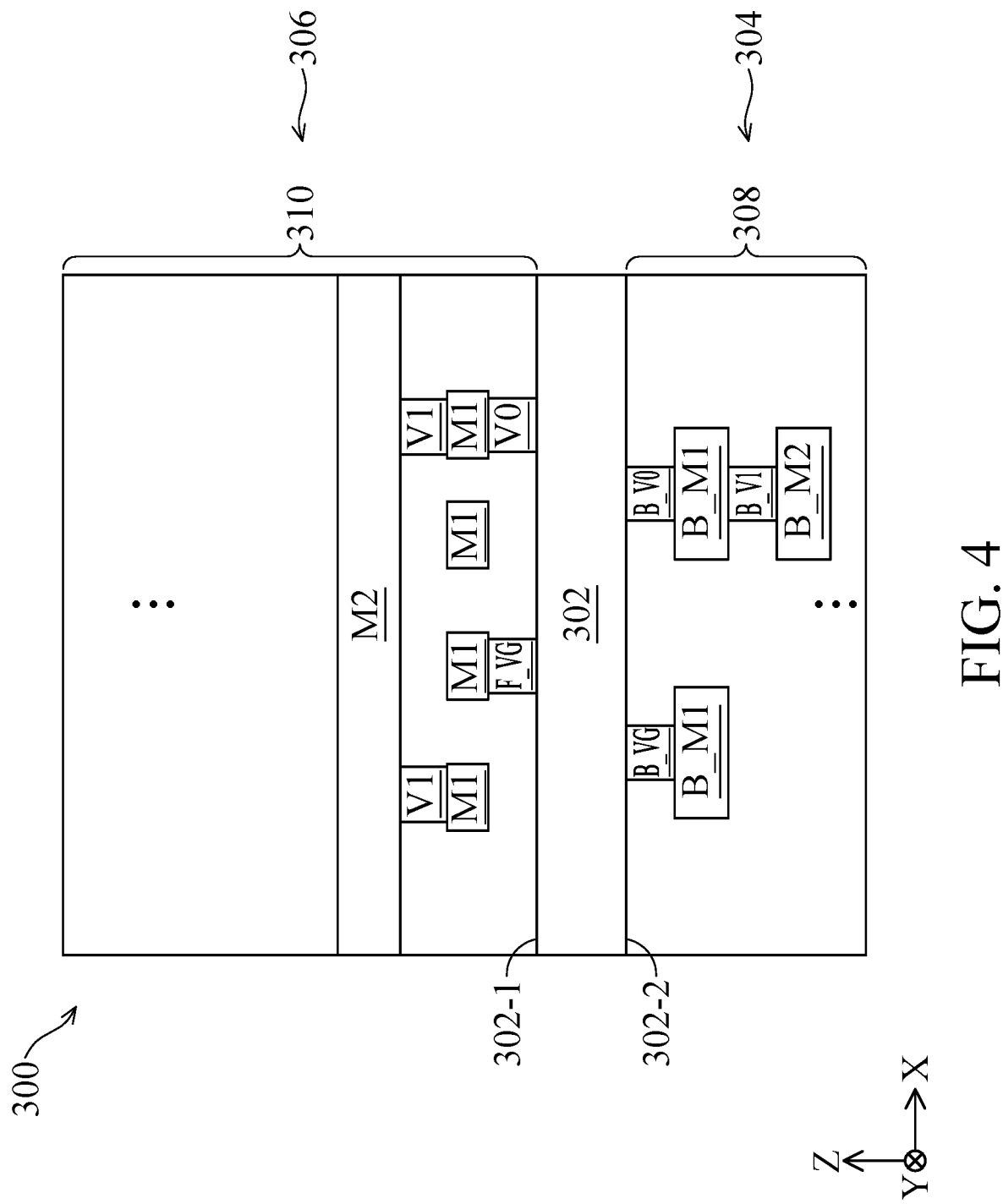
FIG. 4 shows a cross sectional view of a memory structure for illustrating front-side interconnection and back-side interconnection, in accordance with some embodiments of the present disclosure.

Generally, interconnection of devices and circuit cells are disposed over or at front-side of transistors to form desired circuit routing. As transistors and circuit cells continue to be scaled down, space for interconnection routing is also decreased. In order to achieve desired circuit routing, metal conductor width and conductor-to-conductor space are decreased, thereby increasing resistance and parasitic capacitance to impact performance of devices and circuit cells. In some embodiments of present disclosure, a part of interconnection of devices and circuit cells is disposed under or at back-side of transistors to improve upon the above issue. FIG. 4 shows a cross sectional view of a memory structure 300 for illustrating front-side interconnection and back-side interconnection, in accordance with some embodiments of the present disclosure. The memory structure 300 has device region 302 (also referred to as a device layer), back-side interconnection structure 304, and front-side interconnection structure 306. The device region 302 is the region where the transistors and main features are located, such as gate, channel, source/drain, contact features, and the transistors (e.g., the ten transistors of the SRAM 100 discussed above) of the circuit cells discussed above. The device region 302 has front-side 302-1 and back-side 302-2. The back-side interconnection structure 304 is under the device region 302 or at the back-side 302-2 of the device region 302, and the front-side interconnection structure 306 is over the device region 302 or at the front-side 302-1 of the device region 302. The back-side interconnection structure 304 includes inter-metal dielectric (IMD) 308, vias B_VG, B_V0, B_V1, and metal conductors B_M1, B_M2. The front-side interconnection structure 306 includes IMD 310, vias F_VG, V0, V1, and metal conductors M1, M2. The vias and metal conductors in the IMD 308 and 310 electrically couple various transistors and/or components (for example, gate, source/drain features, resistors, capacitors, and/or inductors) in the device region 302, such that the various devices and/or components can operate as specified by the design requirements of circuit cells (e.g., logic cells and memory cells). It should be noted that there may be more vias and metal conductors in the IMD 308 and 310 for connections. The IMD 308 and 310 may be multilayer structure, such as one or more dielectric layers.

Since the back-side interconnection structure 304 is at the back-side 302-2 of the device region 302, the IMD 308, the vias B_VG, B_V0, B_V1, and the metal conductors B_M1, B_M2 may also be referred to as the back-side IMD, the back-side vias, and the back-side metal conductors, respectively. Since the front-side interconnection structure 306 is at the front-side 302-1 of the device region 302, the IMD 310, the vias F_VG, V0, V1, V2, and the metal conductors M1, M2, M3 may also be referred to as the front-side IMD, the front-side vias, and the front-side metal conductors, respectively. In some embodiments, the vias B_VG and VG are connected to the gate structures (gate electrodes) of the transistors. Therefore, the vias B_VG and F_VG are also referred to as the gate vias, or respectively referred to as the back-side gate via and the front-side gate via. In some embodiments, the vias and metal conductors in the IMD 308 and 310 are used for the connections of the features of the transistor. In other embodiments, the vias and metal conductors in the IMD 308 and 310 are connected to voltage sources (the supply voltage VDD or the reference voltage VSS discussed above) to provide voltage to the transistors in the device region 302. Therefore, the metal conductors (e.g., the metal conductors B_M1, B_M2) may be also referred to as the voltage metal conductors, the voltage lines, or voltage conductors.

The back-side interconnection structure 304 and the front-side interconnection structure 306 are formed after various main features and transistors in the device region 302 are formed. The order of formations of the back-side interconnection structure 304 and the front-side interconnection structure may be interchanged. More specifically, in some embodiments, the back-side interconnection structure 304 is formed at first after the formation of the various main features and transistors in the device region 302, and the front-side interconnection structure 306 is then formed after the formation of the back-side interconnection structure 304. In other embodiments, the front-side interconnection structure 306 is formed at first after the formation of the various main features and transistors in the device region 302, and the back-side interconnection structure 304 is then formed.

The formation of the back-side interconnection structure 304 may include removing the substrate (if present) by CMP process, forming a back-side dielectric layer (not shown) under the device region 302, forming back-side contacts (not shown) connected to the source/drain features in the device region 302 in the back-side dielectric layer, forming a first dielectric layer of the IMD 308 under the back-side dielectric layer, forming back-side first level vias (e.g., the vias B_VG and B_V0) in the first dielectric layer, forming a second dielectric layer of the IMD 308 under the first dielectric layer, forming back-side first level metal conductors (e.g., the metal conductors B_M1) in the second dielectric layer, forming a third dielectric layer of the IMD 308 under the second dielectric layer, forming back-side second level vias (e.g., the via B_V1) in the third dielectric layer, forming a fourth dielectric layer of the IMD 308 under the third dielectric layer, forming back-side second level metal conductors (e.g., the metal conductor B_M2) in the fourth dielectric layer, and forming protection layer (may be multiple layers and include dielectric layers, poly layers, or combination) under the fourth dielectric layer. In some embodiments that the back-side interconnection structure 304 is formed after the front-side interconnection structure 306, the formation of the back-side interconnection structure 304 further includes forming back-side bond pads and passivation layer instead of forming the protection layer.

The formation of the front-side interconnection structure 306 may include forming a front-side dielectric layer (not shown) under the device region 302, forming front-side contacts (not shown) connected to the source/drain features in the device region 302 in the front-side dielectric layer, forming a first dielectric layer of the IMD 310 over the front-side dielectric layer, forming front-side first level vias (e.g., the vias F_VG and V0) in the first dielectric layer, forming a second dielectric layer of the IMD 310 over the first dielectric layer, forming front-side first level metal conductors (e.g., the metal conductors MD in the second dielectric layer, forming a third dielectric layer of the IMD 310 over the second dielectric layer, forming front-side second level vias (e.g., the via V1) in the third dielectric layer, forming a fourth dielectric layer of the IMD 310 over the third dielectric layer, forming front-side second level metal conductors (e.g., the metal conductor M2) in the fourth dielectric layer, and forming protection layer (may be multiple layers and include dielectric layers, poly layers, or combination) under the fourth dielectric layer. In some embodiments that the front-side interconnection structure 306 is formed after the back-side interconnection structure 304, the formation of the front-side interconnection structure 306 further includes forming back-side bond pads and passivation layer instead of forming the protection layer.

Figure 5A:
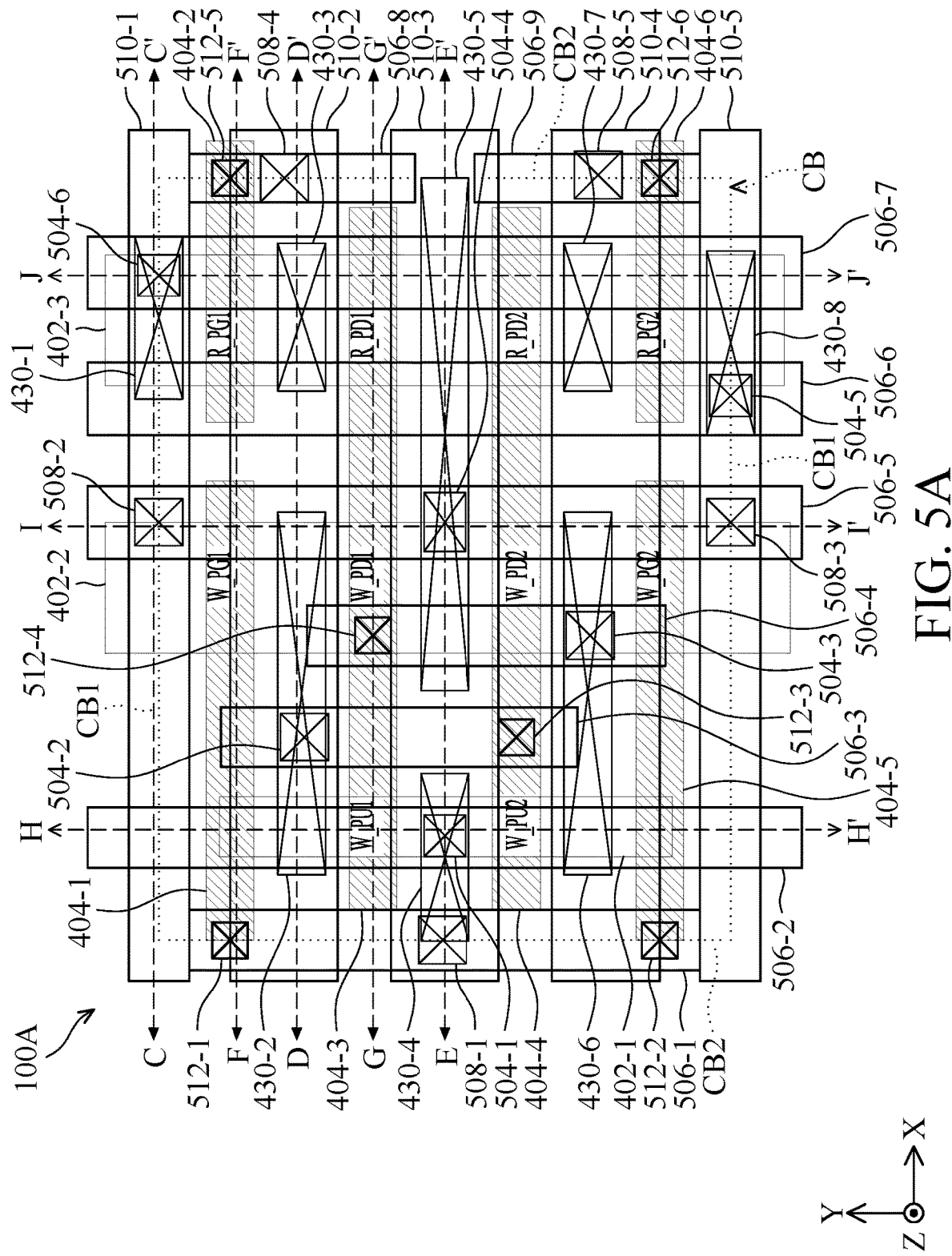
FIGS. 5A and 5B illustrate top views (or layouts) of an SRAM cell that can be one embodiment of the SRAM cell implemented in the memory region, in accordance with some embodiments of the present disclosure.
Figure 5B:
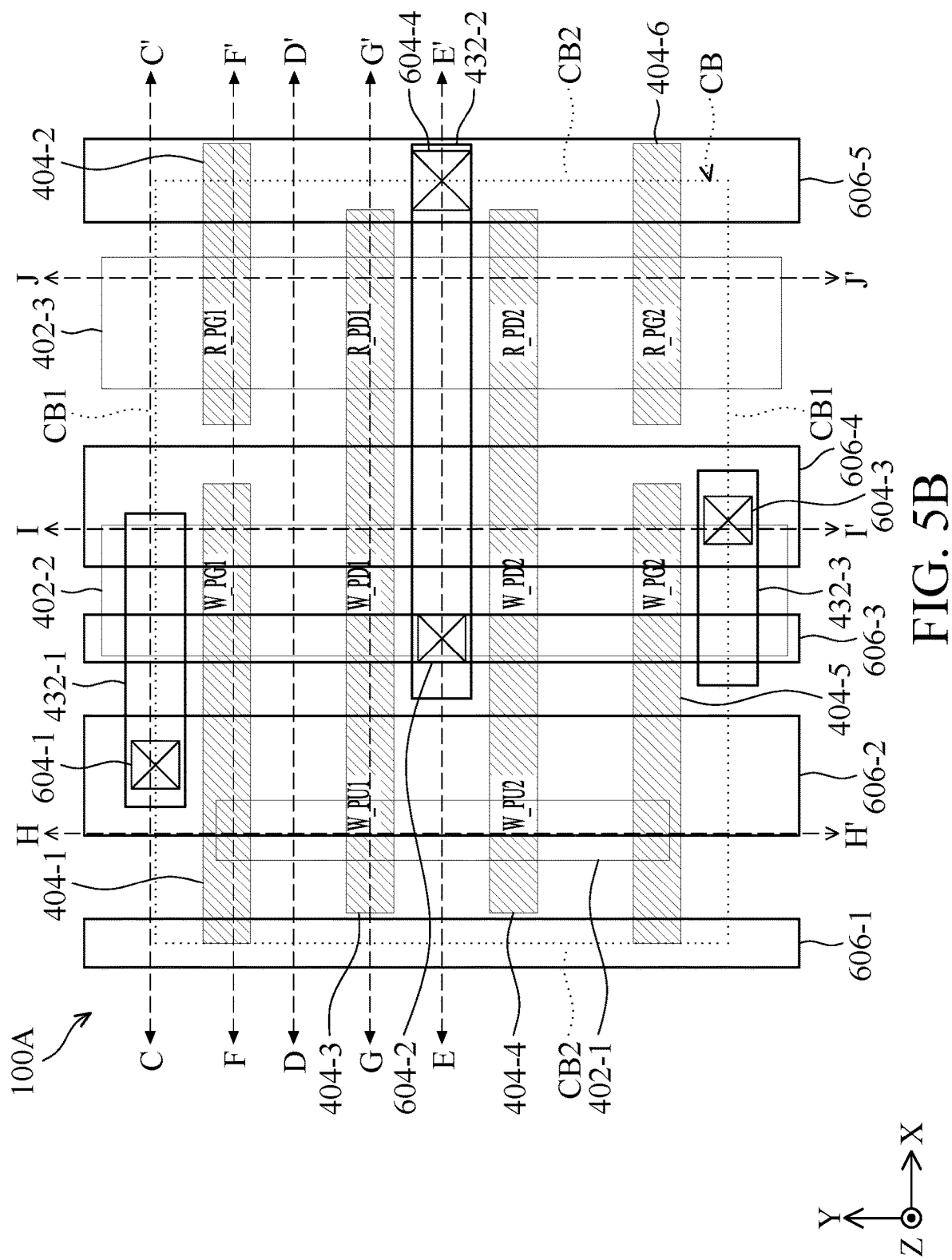

FIGS. 5A and 5B illustrate top views (or layouts) of an SRAM cell 100A that can be one embodiment of the SRAM cell 100 implemented in the memory region 20, in accordance with some embodiments of the present disclosure. FIG. 5A illustrates the features in the device region (including transistors) and the front-side interconnection structure (including vias and metal conductors), and FIG. 5B illustrates the features in the device region and the back-side interconnection structure (including vias and metal conductors).

Figure 5C:
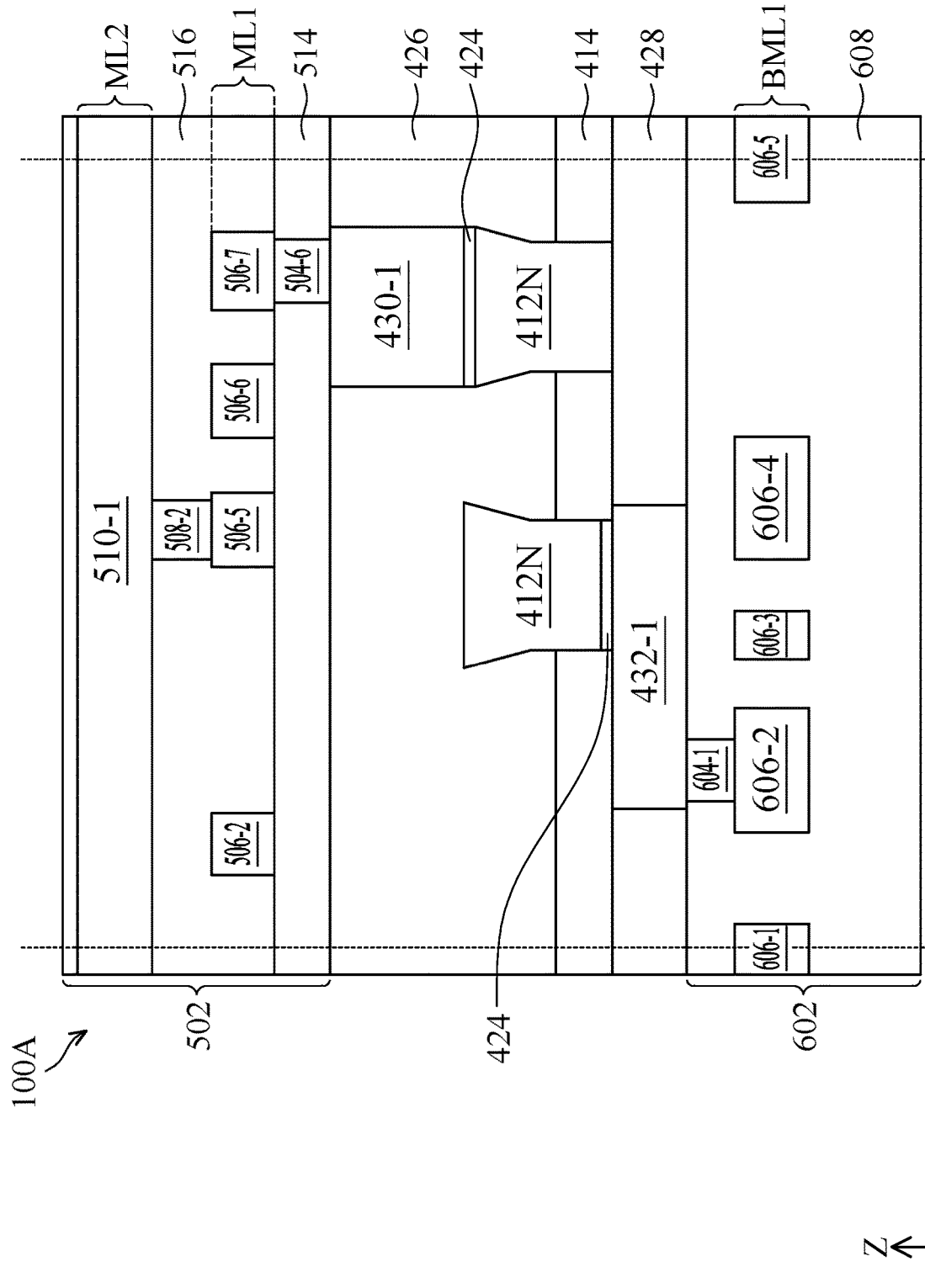
FIG. 5C illustrates a cross sectional view of the SRAM cell along a line C-C' in FIGS. 5A and 5B, in accordance with some embodiments of the present disclosure.
Figure 5D:
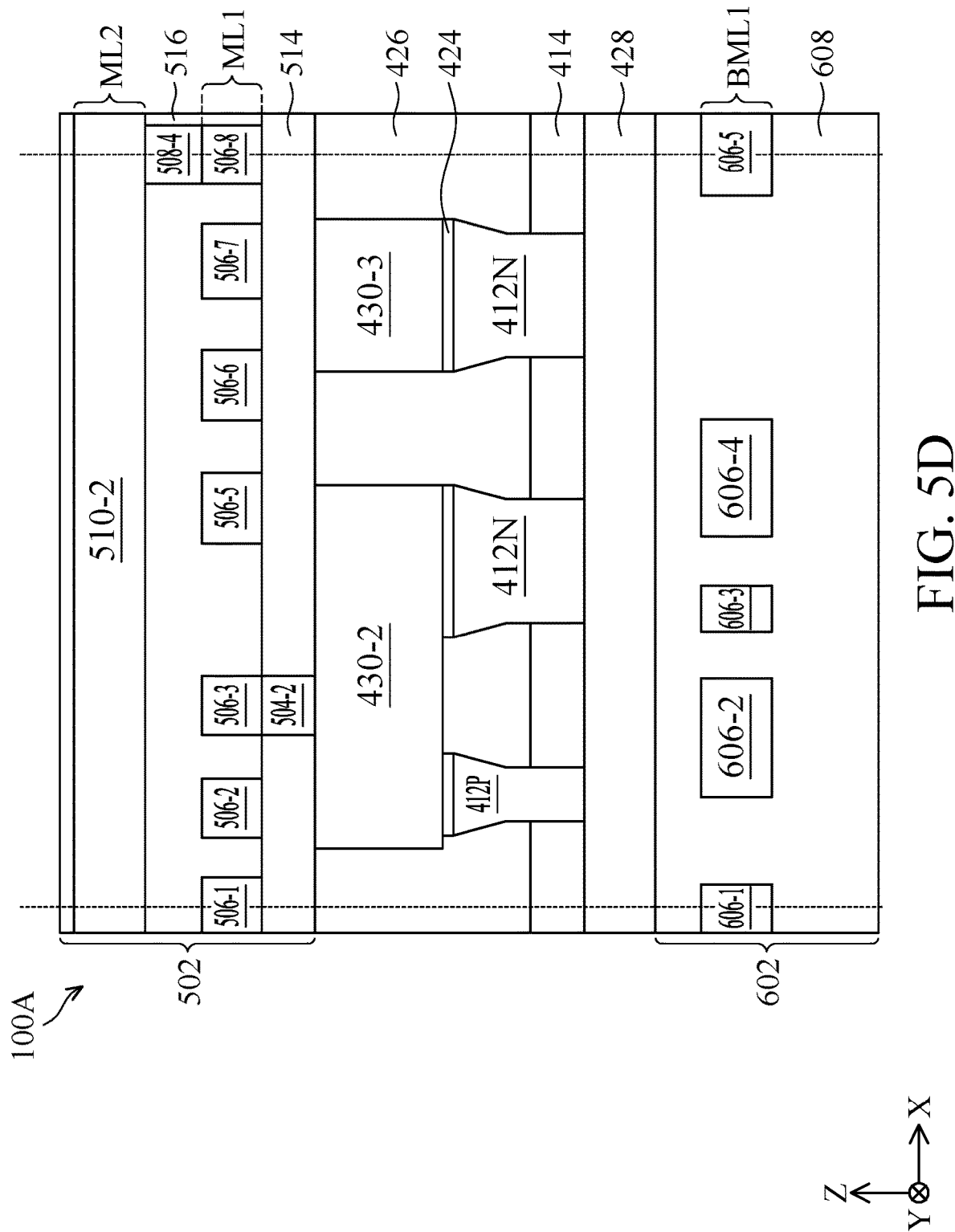
FIG. 5D illustrates a cross sectional view of the SRAM cell along a line D-D' in FIGS. 5A and 5B, in accordance with some embodiments of the present disclosure.
Figure 5E:
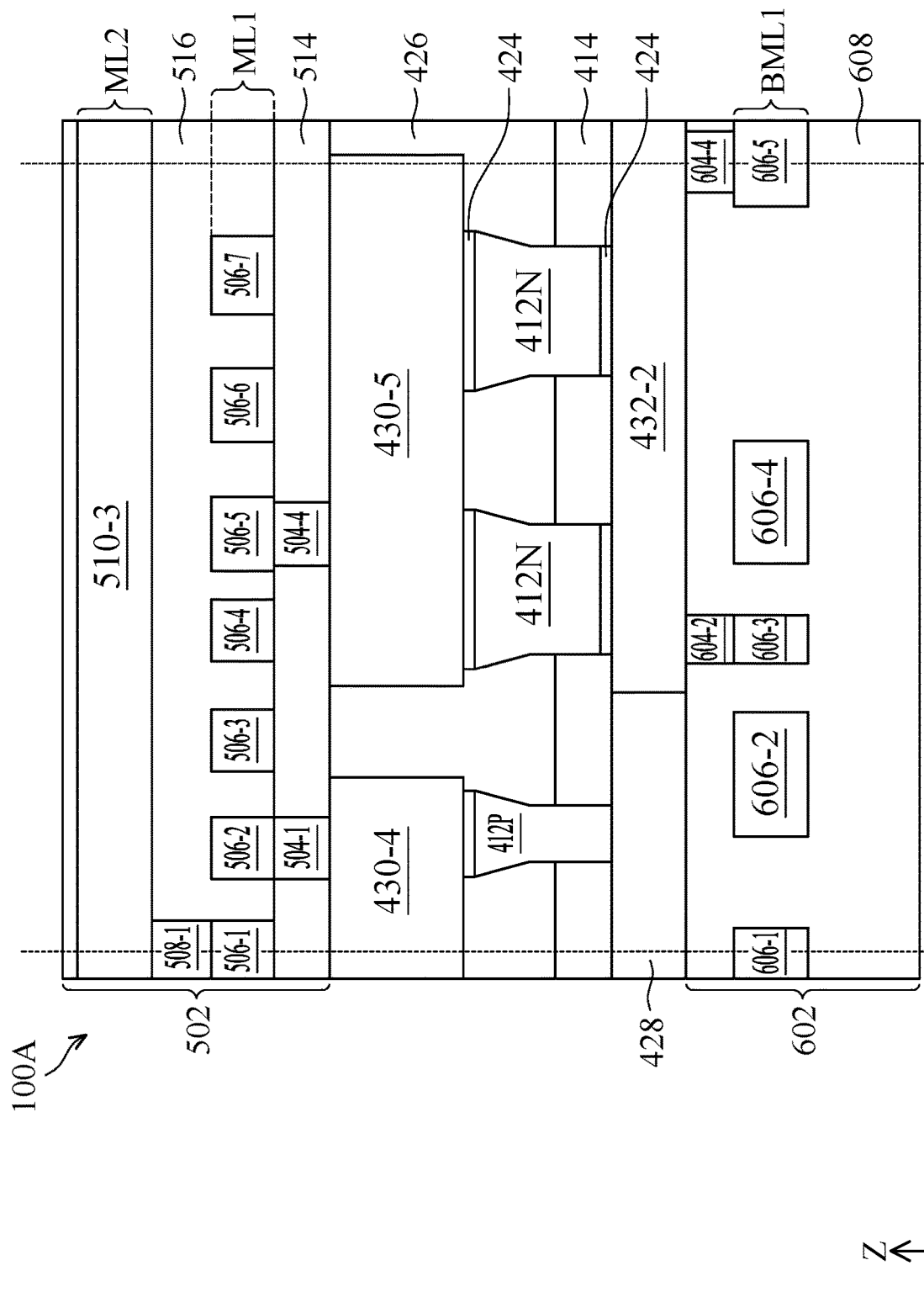
FIG. 5E illustrates a cross sectional view of the SRAM cell along a line E-E' in FIGS. 5A and 5B, in accordance with some embodiments of the present disclosure.
Figure 5F:
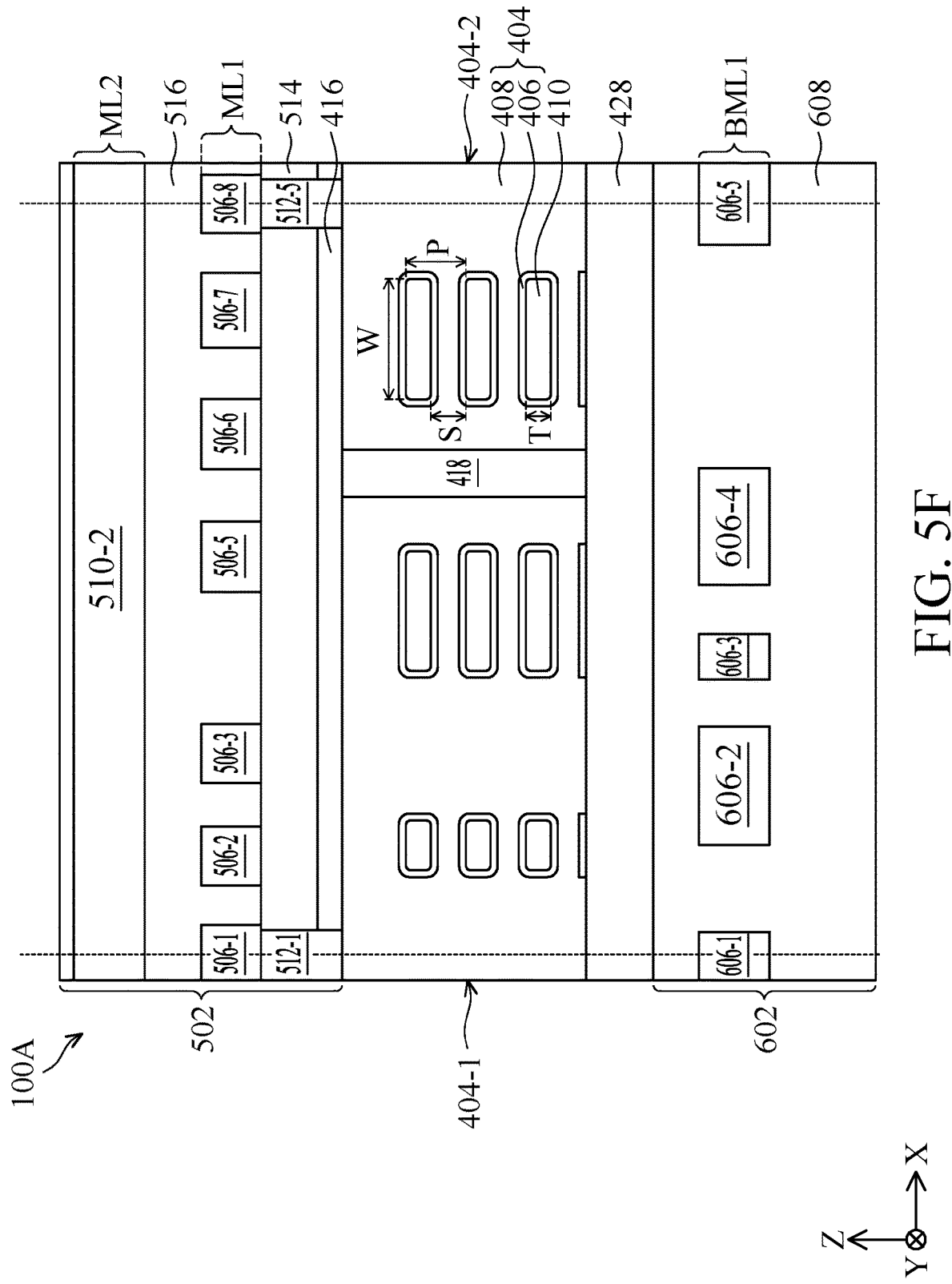
FIG. 5F illustrates a cross sectional view of the SRAM cell along a line F-F' in FIGS. 5A and 5B, in accordance with some embodiments of the present disclosure.
Figure 5G:
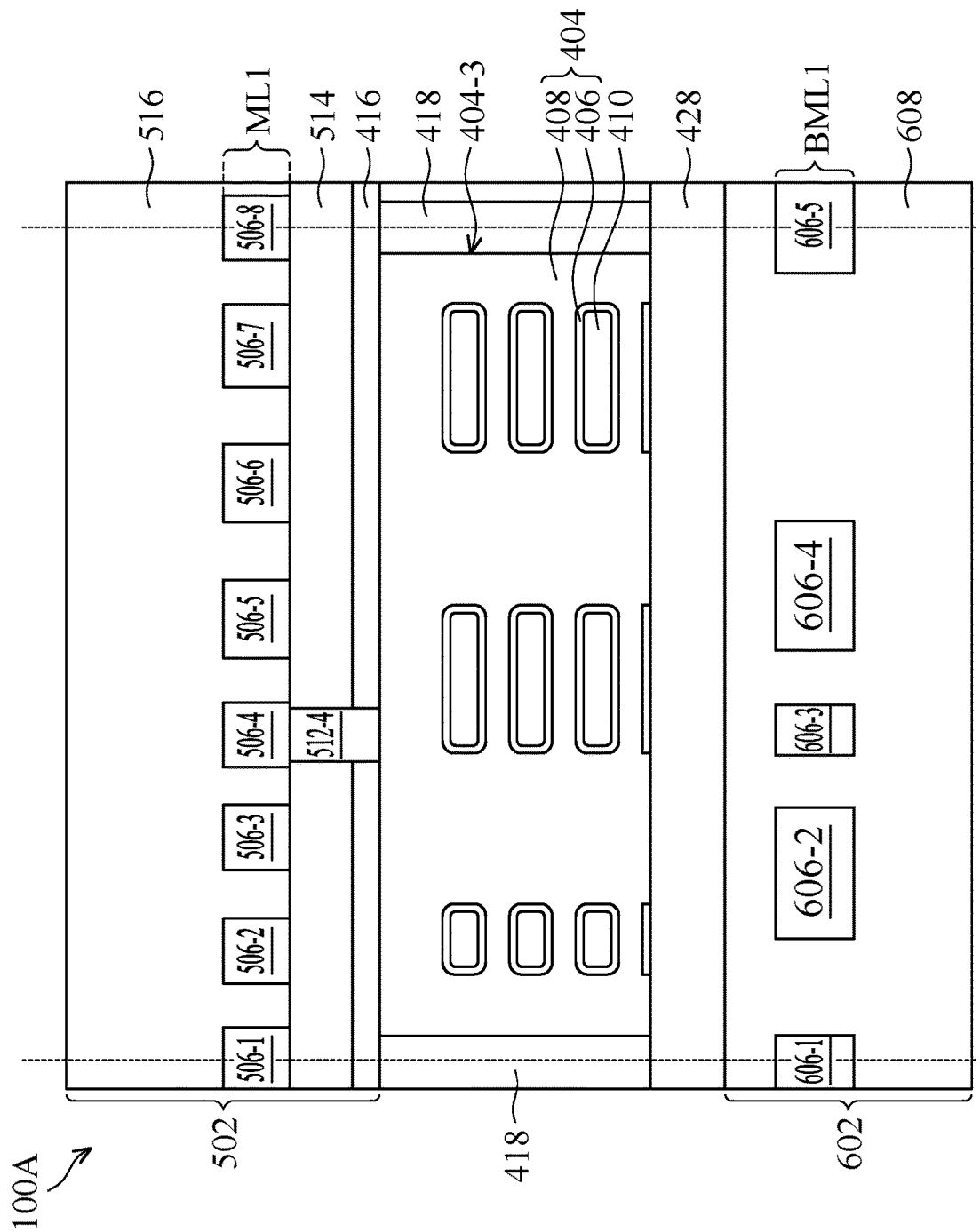
FIG. 5G illustrates a cross sectional view of the SRAM cell along a line G-G' in FIGS. 5A and 5B, in accordance with some embodiments of the present disclosure.
Figure 5H:
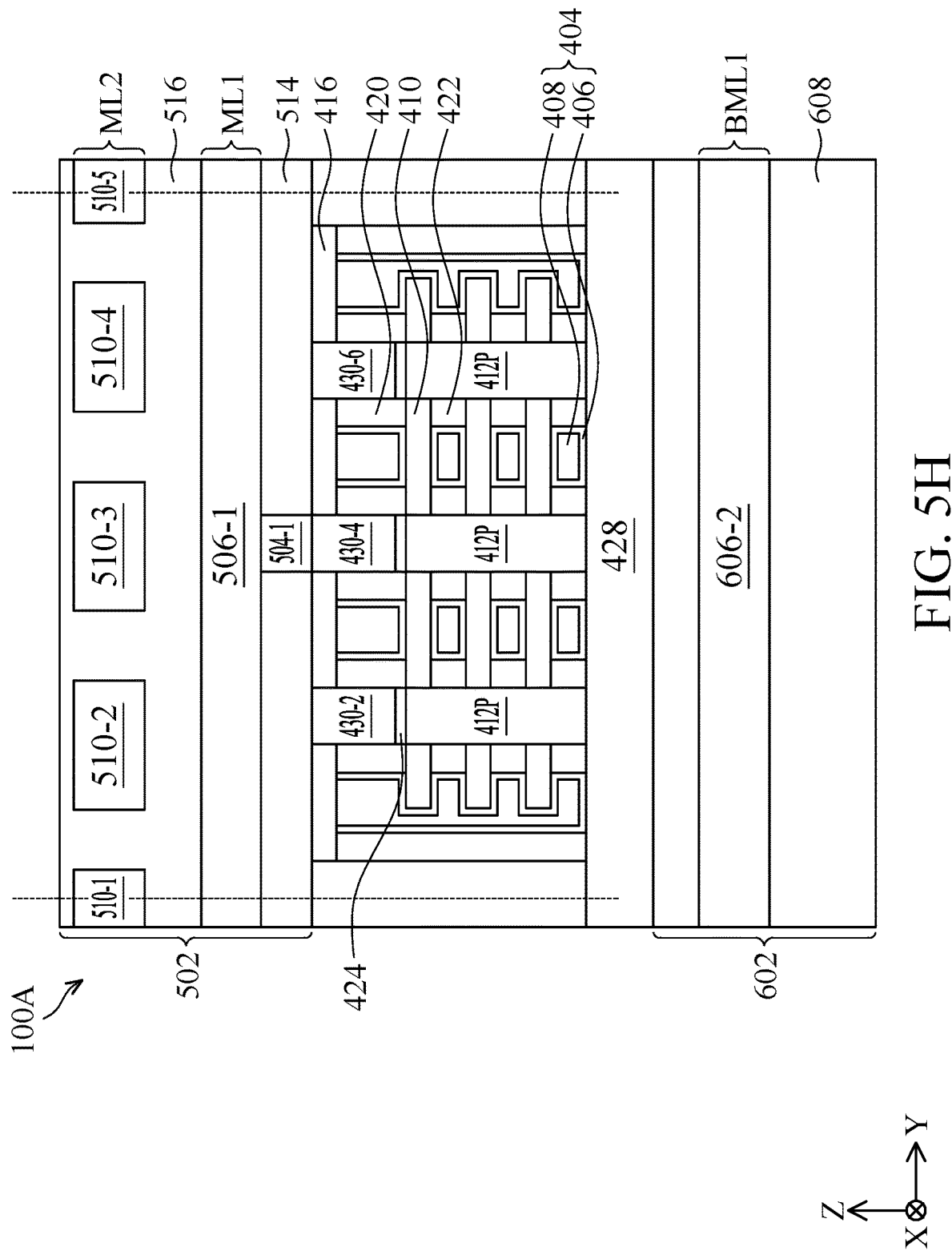
FIG. 5H illustrates a cross sectional view of the SRAM cell along a line H-H' in FIGS. 5A and 5B, in accordance with some embodiments of the present disclosure.
Figure 5I:
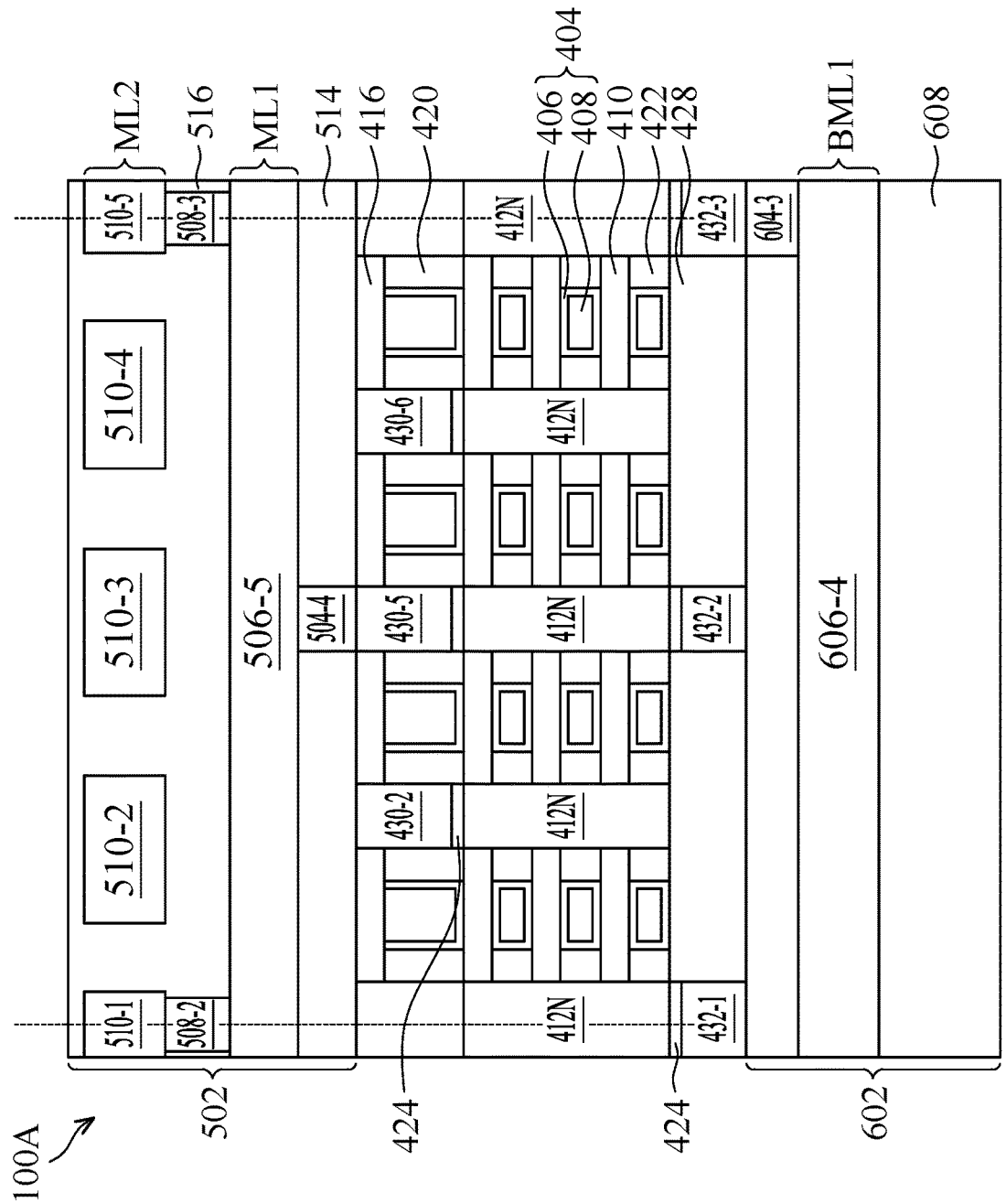
FIG. 5I illustrates a cross sectional view of the SRAM cell along a line I-I' in FIGS. 5A and 5B, in accordance with some embodiments of the present disclosure.
Figure 5J:
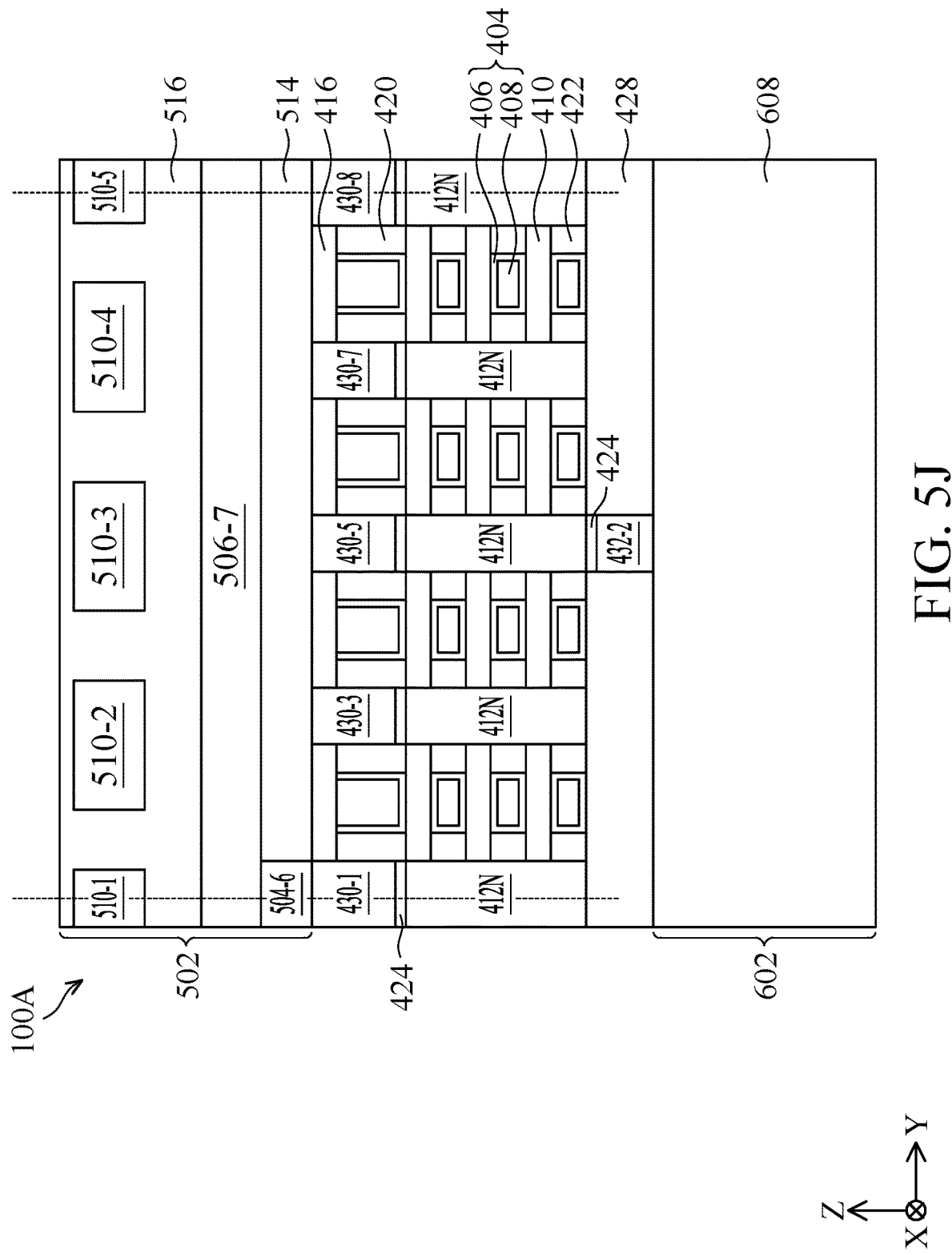
FIG. 5J illustrates a cross sectional view of the SRAM cell along a line J-J' in FIGS. 5A and 5B, in accordance with some embodiments of the present disclosure.

FIG. 5C illustrates a cross sectional view of the SRAM cell 100A along a line C-C' in FIGS. 5A and 5B, in accordance with some embodiments of the present disclosure. FIG. 5D illustrates a cross sectional view of the SRAM cell 100A along a line D-D' in FIGS. 5A and 5B, in accordance with some embodiments of the present disclosure. FIG. 5E illustrates a cross sectional view of the SRAM cell 100A along a line E-E' in FIGS. 5A and 5B, in accordance with some embodiments of the present disclosure. FIG. 5F illustrates a cross sectional view of the SRAM cell 100A along a line F-F' in FIGS. 5A and 5B, in accordance with some embodiments of the present disclosure. FIG. 5G illustrates a cross sectional view of the SRAM cell 100A along a line G-G' in FIGS. 5A and 5B, in accordance with some embodiments of the present disclosure. FIG. 5H illustrates a cross sectional view of the SRAM cell 100A along a line G-G' in FIGS. 5A and 5B, in accordance with some embodiments of the present disclosure. FIG. 5I illustrates a cross sectional view of the SRAM cell 100A along a line G-G' in FIGS. 5A and 5B, in accordance with some embodiments of the present disclosure. FIG. 5J illustrates a cross sectional view of the SRAM cell 100A along a line G-G' in FIGS. 5A and 5B, in accordance with some embodiments of the present disclosure.

As shown in FIGS. 5A and 5B, the SRAM cell 100A has a cell boundary CB with a rectangular shape (indicated by the dotted rectangular box) and constructed by two boundaries CB1 in the X-direction and two boundaries CB2 in the Y-direction. The length of one boundary CB1 is also the pitch of the SRAM cells 100A in the X-direction, and the length of one boundary CB2 is also the pitch of the SRAM cells 100A in the Y-direction. In some embodiments, the ratio of the length of the boundary CB1 to the length of the boundary CB2 is in a range from about 1 to about 1.5.

The SRAM cell 100A includes active areas, such as active areas 402-1 to 402-3, (may be collectively referred to as the active areas 402) that extend lengthwise in the Y-direction and are arranged in the X-direction. Each of active areas 402 includes channel regions, source regions, and drain regions (where source regions and drain regions are collectively referred to as source/drain regions herein) of transistors. The SRAM cell 100A further includes gate structures, such as gate structures 404-1 to 404-6 (may be collectively referred to as the gate structures 404) that extend lengthwise in the X-direction perpendicular to the Y-direction. The gate structures 404-1 to 404-6 are disposed over the channel regions of the respective active areas 402-1 to 402-3 (i.e., (vertically stacked) nanostructures 410) and disposed between respective source/drain regions of the active areas 402-1 to 402-3 (i.e., source/drain features 412N and 412P). In some embodiments, the gate structures 404-1 to 404-6 wrap and/or surround suspended, vertically stacked nanostructures 410 in the channel regions of the active areas 402-1 to 402-3, respectively (as shown in FIGS. 5F to 5J).

The gate structure 404-1 extends across the active area 402-2 in the top view and engages the active area 402-2 to form the write-port PG transistor W_PG1; the gate structure 404-2 extends across the active area 402-3 in the top view and engages the active area 402-3 to form the read-port PG transistor R_PG1; the gate structure 404-3 extends across the active areas 402-1 to 402-3 in the top view and engages the active area 402-1 to 402-3 to form the write-port PU transistor W_PU1, the write-port PD transistor W_PD1, and the read-port PD transistor R_PD1 respectively; the gate structure 404-4 extends across the active areas 402-1 to 402-3 in the top view and engages the active area 402-1 to 402-3 to form the write-port PU transistor W_PU2, the write-port PD transistor W_PD2, and the read-port PD transistor R_PD2 respectively; the gate structure 404-5 extends across the active area 402-2 in the top view and engages the active area 402-2 to form the write-port PG transistor W_PG2; and the gate structure 404-6 extends across the active area 402-3 in the top view and engages the active area 402-3 to form the read-port PG transistor R_PG2. As shown in FIGS. 5A and 5B, the write-port PU transistor W_PU1 and the write-port PU transistor W_PU2 are arranged in the Y-direction and share the active area 402-1;

the write-port PG transistor W_PG1, the write-port PD transistor W_PD1, the write-port PD transistor W_PD2, and the write-port PG transistor W_PG2 are arranged in the Y-direction and share the active area 402-2; and the read-port PG transistor R_PG1, the read-port PD transistor R_PD1, the read-port PD transistor R_PD2, and the read-port PG transistor R_PG2 are arranged in the Y-direction and share the active area 402-3.

Similar to the isolation feature 218 discussed above, the SRAM cell 100A further includes an isolation feature (or isolation structure) 414. The isolation feature 414 may include silicon oxide, silicon nitride, silicon oxynitride, other suitable isolation material (for example, including silicon, oxygen, nitrogen, carbon, or other suitable isolation constituent), or combinations thereof. The isolation feature 414 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the SRAM cell 100A (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2) includes nanostructures 410 similar to the nanostructures 204 discussed above. As shown in FIGS. 5F to 5J, the nanostructures 410 are suspended. In some embodiments, three nanostructures 410 are vertically stacked (or vertically arranged) from each other in the Z-direction for one transistor. However, there may be another appropriate number of nanostructures in one transistor. For example, there may be from 2 to 6 nanostructures 410 in one transistor. The nanostructures 410 further extend lengthwise in the Y-direction (FIGS. 5H to 5J) and widthwise in the X-direction (FIGS. 5F and 5G). In some embodiments, each of the nanostructures 410 has a width W in the X-direction and in a range from about 4 nm to about 70 nm, as shown in FIG. 5F. In some embodiments, the nanostructures 410 in the active area 402-1 have a wider width in the X-direction than the nanostructures 410 in the active areas 402-2 and 402-3, as shown in FIGS. 5A, 5B, 5F, and 5G. In some embodiments, each of the nanostructures 410 has a thickness T in the Z-direction and in a range from about 4 nm to about 8 nm, as shown in FIG. 5F. As shown in FIG. 5F, in each of the transistors in the SRAM cell 100A, three nanostructures 410 are spaced apart from each other in the Z-direction by a distance S in a range from about 6 nm to about 15 nm. In some embodiments, the nanostructures 410 have vertically a pitch P in the Z-direction and in a range from about 10 nm to about 23 nm. The nanostructures 410 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 410 include silicon for n-type transistors, such as the write-port PD transistors W_PD1 and W_PD2, the write-port PG transistors W_PG1 and W_PG2, the read-port PD transistors R_PD1 and R_PD2, and the read-port PG transistors R_PG1 and R_PG2. In other embodiments, the nanostructures 410 include silicon germanium for p-type transistors, such as the write-port PU transistors W_PU1 and W_PU2. In some embodiments, the nanostructures 410 are all made of silicon, and the type of the transistors depend on work function metal layer wrapping around the nanostructures 410. In some embodiments, the nanostructures 410 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

In some embodiments, each of the gate structures 404-1 to 404-6 has a gate length in the Y-direction and in a range from about 6 nm to about 40 nm. Each of the gate structures 404-1 to 404-6 has a gate dielectric layer 406 and a gate electrode layer 408. The gate dielectric layers 406 wrap around each of the nanostructures 410 and the gate electrodes layer 408 wrap around the gate dielectric layer 406. In some embodiments, the gate structures 404 each further includes an interfacial layer (such as having silicon dioxide, silicon oxynitride, or other suitable materials) between the gate dielectric layer 406 and the nanostructures 410. The gate dielectric layers 406 may include oxide with nitrogen doped dielectric material (initial layer) combined with metal content high-K dielectric material (K value (dielectric constant)>13). For example, gate dielectric layers 406 may include hafnium oxide ($HfO_2$), which has a dielectric constant in a range from about 18 to about 40. Alternatively, the gate dielectric layers 406 may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 406 may be formed by chemical oxidation, thermal oxidation, ALD, CVD, and/or other suitable methods.

The gate electrode layer 408 is formed to wrap around the gate dielectric layer 406 and the center portions of the nanostructures 410, as shown in FIGS. 5H to 5J. In some embodiments, the gate electrode layer 408 may include an n-type work function metal layer for n-type transistor (such as the write-port PD transistors W_PD1 and W_PD2, the write-port PG transistors W_PG1 and W_PG2, the read-port PD transistors R_PD1 and R_PD2, and the read-port PG transistors R_PG1 and R_PG2) or a p-type work function metal layer for p-type transistor (such as the write-port PU transistors W_PU1 and W_PU2). In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

In some embodiments, the gate electrode layer 408 may include a single layer or alternatively a multi-layer structure. In some embodiments, the gate electrode layer 408 may further include a capping layer, a barrier layer, and a fill material (not shown). The capping layer may be formed adjacent to the gate dielectric layers 406 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The SRAM cell 100A further includes gate top dielectric layers 416 are over the gate dielectric layers 406, the gate electrodes 408, and the nanostructures 410. The gate top dielectric layers 416 are similar to the gate top dielectric layer 214 discussed above. The gate top dielectric layer 416 is used for contact etch protection layer. In some embodiments, the gate top dielectric layer 416 has a thickness in a range from about 2 nm to about 60 nm. The material of gate top dielectric layer 416 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

As shown in FIGS. 5F and 5G, gate end dielectrics 418 are at ends of the gate structures 404. The gate end dielectrics 418 are used for separating the gate structures 404 aligned in the X-direction. For example, the gate end dielectrics 418 separate the gate structures 404-1 and 404-2, as shown in FIG. 5F. The material of the gate end dielectrics 418 is selected from a group consisting of $Si_3N_4$, nitride-base dielectric, carbon-base dielectric, high K material (K>=9), or a combination thereof.

The SRAM cell 100A further includes gate spacers 420 are on sidewalls of the gate structures 404 and over the nanostructures 410, as shown in FIGS. 5H to 5J. More specifically, the gate spacers 420 are over the nanostructures 410 and on top sidewalls of the gate structures 404, and thus are also referred to as gate top spacers or top spacers. The gate spacers 420 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 420 may include a single layer or a multi-layer structure.

As shown in FIGS. 5H to 5J, the SRAM cell 100A further includes inner spacers 422 on the sidewalls of the gate structures 404 and below the topmost nanostructures 410. Furthermore, the inner spacers 422 are laterally between the source/drain features 412N (or 412P) and the gate structures 404. The inner spacers 422 are also vertically between adjacent nanostructures 410. The inner spacers 422 may include a dielectric material having higher K value (dielectric constant) than the gate spacers 420 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the gate spacers 420 and the inner spacers 422 have a thickness in the Y-direction and in a range from about 4 nm to about 12 nm. In some embodiments, the thickness of the gate spacers 420 in the Y-direction and the thickness of the inner spacers 422 in the Y-direction are the same. In other embodiments, the thickness of the gate spacers 420 in the Y-direction is less than the thickness of the inner spacers 422 in the Y-direction due to the gate spacers 420 are trimmed during sequent processes for forming source/drain contacts.

Referring to FIGS. 7C and 7E to 7G, the SRAM cell 100A further includes source/drain features 412N and source/drain features 412P in the source/drain regions of the active areas 402. The source/drain features 412N are disposed over both sides of the respective gate structure 404 and connected by the nanostructures 410 to form n-type transistor (e.g., the write-port PD transistors W_PD1 and W_PD2, the write-port PG transistors W_PG1 and W_PG2, the read-port PD transistors R_PD1 and R_PD2, and the read-port PG transistors R_PG1 and R_PG2). Similarly, the source/drain features 412P are disposed over both sides of the respective gate structure 404 and connected by the nanostructures 410 to form p-type transistor (e.g., the write-port PU transistors W_PU1 and W_PU2).

The source/drain features 412N and 412P may be formed by using epitaxial growth. In some embodiments, the source/drain features 412N may include epitaxially-grown material selected from a group consisting of SiP, SiC, SiPC, SiAs, Si, or a combination thereof. In some embodiments, the epitaxially-grown material of the source/drain features 412N may be doped with phosphorus (or arsenic, or both) having a doping concentration in a range from about $2\times10^{19}/cm^3$ to $3\times10^{21}/cm^3$. In some embodiments, the source/drain features 412P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 412P may be doped with boron having a doping concentration in a range from about $1\times10^{19}/cm^3$ to $6\times10^{20}/cm^3$.

As shown in FIGS. 5C to 5E and 5H to 5J, the SRAM cell 100A further includes silicide features 424 over or under the source/drain features 412N and 412P. The silicide features 424 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 5A to 5E and 5H to 5J, the SRAM cell 100A further includes source/drain contacts 430 (including source/drain contacts 430-1 to 430-8) in an inter-layer dielectric (ILD) layer 426 and source/drain contacts 432 (including source/drain contacts 432-1 to 432-3) in a dielectric layer 428. As shown in FIGS. 5A and 5B, the source/drain contacts 430 and 432 extend lengthwise in the X-direction. The source/drain contacts 430 are self-aligned source/drain contacts. This means that the source/drain contacts 430 are formed by using the gate spacers 420 as mask. Therefore, the source/drain contacts 430 are in direct contact with the gate spacers 420, as shown in FIGS. 5H to 5J. In some embodiments, the gate spacers 420 are trimmed due to the gate spacers 420 serving as the mask for forming the source/drain contacts 430. Therefore, the thickness of the gate spacers 420 in the Y-direction is less than the thickness of the inner spacers 422 in the Y-direction, as discussed above.

In the top view, as shown in FIG. 5A, the source/drain contact 430-1 lengthwise overlaps the boundary CB1 and is adjacent to the gate structure 404-2 (or is adjacent to the read-port PG transistor R_PG1); the source/drain contact 430-2 is between the gate structures 404-1 and 404-3 (or between the write-port PG transistor W_PG1 and the write-port PD transistor W_PD1) in the Y-direction; the source/drain contact 430-3 is between the gate structures 404-2 and 404-3 (or between the read-port PG transistor R_PG1 and the read-port PD transistor R_PD1) in the Y-direction; the source/drain contact 430-4 is between the gate structures 404-3 and 404-4 (or between the write-port PU transistors W_PU1 and W_PU2) in the Y-direction; the source/drain contact 430-5 is between the gate structures 404-3 and 404-4 (or between the write-port PD transistors W_PD1 and W_PD2 or between the read-port PD transistors R_PD1 and R_PD2) in the Y-direction; the source/drain contact 430-6 is between the gate structures 404-4 and 404-5 (or between the write-port PD transistor W_PD2 and the write-port PG transistor W_PG2) in the Y-direction; the source/drain contact 430-7 is between the gate structures 404-4 and 404-6 (or between the read-port PD transistor R_PD2 and the read-port PG transistor R_PG2) in the Y-direction; and the source/drain contact 430-8 lengthwise overlaps the boundary CB1 and is adjacent to the gate structure 404-6 (or is adjacent to the write-port PG transistor W_PG1).

In the top view, as shown in FIG. 5B, the source/drain contact 432-1 lengthwise overlaps the boundary CB1 and is adjacent to the gate structure 404-1 (or is adjacent to the read-port PG transistor R_PG1); the source/drain contact 432-2 is between the gate structures 404-3 and 404-4 (or between the write-port PD transistor W_PD1 and W_PD2 or between the read-port PD transistor R_PD1 and R_PD2) in the Y-direction; and the source/drain contact 432-3 lengthwise overlaps the boundary CB1 and is adjacent to the gate structure 404-5 (or is adjacent to the read-port PG transistor R_PG2).

Furthermore, each of the source/drain contacts 430 is over and electrically connected to the respective source/drain features 412N/412P and each of the source/drain contacts 432 is under electrically connected to the respective source/drain features 412N/412P. Specifically, as shown in FIGS. 5A to 5J, the source/drain contact 430-1 is over and electrically connected to the source/drain feature 412N of the read-port PG transistor R_PG1; the source/drain contact 430-2 is over and electrically connected to the source/drain feature 412N shared by the write-port PG transistor W_PG1 and the write-port PD transistor W_PD1 (also referred to as common source/drain or common drain) and the source/drain feature 412P of the write-port PU transistor W_PU1, which corresponds to the data node ND shown in FIG. 2; the source/drain contact 430-3 is over and electrically connected to the source/drain feature 412N shared by the read-port PG transistor R_PG1 and the read-port PD transistor R_PD1; the source/drain contact 430-4 is over and electrically connected to the source/drain feature 412P shared by the write-port PU transistors W_PU1 and W_PU2; the source/drain contact 430-5 is over and electrically connected to the source/drain feature 412N shared by the write-port PD transistor W_PD1 and W_PD2 and the source/drain feature 412N shared by the read-port PD transistors R_PD1 and R_PD2; the source/drain contact 430-6 is over and electrically connected to the source/drain feature 412N shared by the write-port PG transistor W_PG2 and the write-port PD transistor W_PD2 (also referred to as common source/drain or common drain) and the source/drain feature 412P of the write-port PU transistor W_PU2, which corresponds to the data node NDB shown in FIG. 2; the source/drain contact 430-7 is over and electrically connected to the source/drain feature 412N shared by the read-port PG transistor R_PG2 and the read-port PD transistor R_PD2; and the source/drain contact 430-8 is over and electrically connected to the source/drain feature 412N of the read-port PG transistor R_PG2.

As shown in FIGS. 5A to 5J, the source/drain contact 432-1 is under and electrically connected to the source/drain feature 412N of the write-port PG transistor W_PG1; the source/drain contact 432-2 is under and electrically connected to the source/drain feature 412N shared by the write-port PD transistor W_PD1 and W_PD2 and the source/drain feature 412N shared by the read-port PD transistors R_PD1 and R_PD2; and the source/drain contact 432-3 is under and electrically connected to the source/drain feature 412N of the write-port PG transistor W_PG2. In some embodiments, the source/drain contacts 430 may be referred to as front-side source/drain contacts due to the source/drain contacts 430 are over the source/drain features 412N/412P. In some embodiments, the source/drain contacts 432 may be referred to as back-side source/drain contacts due to the source/drain contacts 432 are under the source/drain features 412N/412P.

The source/drain contacts 430 and 432 may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 430 and 432 may each include single conductive material layer or multiple conductive layers.

As discussed above, the front-side interconnection structure is over the device region or at the front-side of the device region. The SRAM cell 100A further includes a front-side interconnection structure 502 including vias 504 (including vias 504-1 to 504-6), metal conductors 506 (including metal conductors 506-1 to 506-9), vias 508 (including vias 508-1 to 508-5), metal conductors 510 (including metal conductors 510-1 and 510-5), gate vias 512 (including gate vias 512-1 and 512-6), an ILD layer 514, and an IMD layer 516, which are over (or at the front-side of) the transistors in the SRAM cell 100A (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2).

The metal conductors 506 are in a (front-side) metal layer ML1 in the IMD layer 516 and extend lengthwise in the Y-direction. The metal conductors 510 are in a (front-side) metal layer ML2 in the IMD layer 516 and extend lengthwise in the X-direction. The metal layer ML1 is over the SRAM cell 100A and the metal layer ML2 is over the metal layer ML1, and thus the metal conductors 506 are over the transistors (including the source/drain contacts 430, the source/drain features 412N/412P, the nanostructures 410, and gate structures 404) of the SRAM cell 100A and the metal conductors 510 are over the metal conductors 506.

Each of the vias 504 in the ILD layer 514 is vertically between and electrically connected to the respective source/drain contact 430 and the respective metal conductor 506. Each of the gate vias 512 in the ILD layer 514 is vertically between and electrically connected to the respective gate structure 404 and the respective metal conductor 506. Each of the vias 508 in the IMD layer 516 is vertically between and electrically connected to the respective metal conductor 506 and the respective metal conductor 510. In some embodiments, the vias 504, the vias 508, and the gate vias 512 may have a rectangular shape in the top view. In other embodiments, the vias 504, the vias 508, and the gate vias 512 may have a circular shape in the top view.

The vias 504, the metal conductors 506, the vias 508, the metal conductors 510, and the gate vias 512 may be respectively similar to the via V0, the metal conductors M1, the vias V1, the metal conductors M2, and the via F_VG discussed above. The vias 504 and 508, the gate vias 512, the metal conductors 506 and 510, the ILD layer 514, and IMD layer 516 may also be referred to as front-side vias, front-side gate vias, front-side metal conductors, front-side ILD layer, and front-side IMD layer, respectively.

In some embodiments, the metal conductors 510-2 and 510-4 respectively serve as the read word-lines RWL1 and RWL2 discussed above that controls and electrically connected to the gate structures (more specifically, the gate electrodes) of the read-port PG transistors. As shown in FIGS. 5A to 5J, in the SRAM cell 100A, the metal conductors 510-2 and 510-4 are over the read-port PG transistors R_PG1 and R_PG2. The metal conductor 510-2 is electrically connected to the gate structure 404-2 of the read-port PG transistor R_PG1 through the via 508-4, the metal conductor 506-8, and the gate via 512-5, and the metal conductor 510-4 is electrically connected to the gate structure 404-6 of the read-port PG transistor R_PG2 through the via 508-5, the metal conductor 506-9, and the gate via 512-6. In some embodiments, the metal conductors 510-2 and 510-4 may be referred to as (front-side) read word-line conductor. In some embodiments, the metal conductors 506-8 and 506-9 may be referred to as read word-line landing pads. Furthermore, the metal conductors 506-8 and 506-9 lengthwise overlap the boundaries CB2 in the top view, as shown in FIG. 5A.

In some embodiments, the metal conductor 510-3 serves as the write word-line WWL discussed above that controls and electrically connected to the gate structures (more specifically, the gate electrodes) of the write-port PG transistors. As shown in FIGS. 5A to 5J, in the SRAM cell 100A, the metal conductor 510-3 is over the write-port PG transistors W_PG1 and W_PG2. The metal conductor 510-3 is between the metal conductors 510-2 and 510-4 in the Y-direction. The metal conductor 510-3 is electrically connected to the gate structure 404-1 of the write-port PG transistor W_PG1 through the via 508-1, the metal conductor 506-1, and the gate via 512-1, and is electrically connected to the gate structure 404-5 of the write-port PG transistor W_PG2 through the via 508-1, the metal conductor 506-1, and the gate via 512-2. In some embodiments, the metal conductor 510-3 may be referred to as (front-side) write word-line conductor. In some embodiments, the metal conductor 506-1 may be referred to as write word-line landing pad. Furthermore, the metal conductor 506-1 lengthwise overlaps the boundary CB2 in the top view, as shown in FIG. 5A.

In some embodiments, the metal conductors 506-7 and 506-6 respectively serve as the read bit-lines RBL1 and RBL2 discussed above that electrically connected to the source/drain features of the read-port PG transistors. As shown in FIGS. 5A to 5J, in the SRAM cell 100A, the metal conductors 506-7 and 506-6 are over the read-port PG transistors R_PG1 and R_PG2. The metal conductor 506-7 is electrically connected to the source/drain feature 412N of the read-port PG transistor R_PG1 through the via 504-6 and the source/drain contact 430-1, and the metal conductor 506-6 is electrically connected to the source/drain feature 412N of the read-port PG transistor R_PG2 through the via 504-5 and the source/drain contact 430-8. In some embodiments, the metal conductors 506-7 and 506-6 may be referred to as (front-side) read bit-line conductor.

In some embodiments, the metal conductor 506-5 serves as VSS line that is electrically coupled to a voltage source (not shown) (e.g., the reference voltage VSS discussed above) and electrically connected to the source/drain features of the write-port PD transistors and the read-port PD transistors. As shown in FIGS. 5A to 5J, in the SRAM cell 100A, the metal conductor 506-5 is over the write-port PD transistors W_PD1 and W_PD2 and the read-port PD transistors R_PD1 and R_PD2. The metal conductor 506-5 is electrically connected to the source/drain feature 412N shared by the write-port PD transistor W_PD1 and W_PD2 and the source/drain feature 412N shared by the read-port PD transistors R_PD1 and R_PD2 through the via 504-4 and the source/drain contact 430-5. In some embodiments, the metal conductor 506-5 may be referred to as (front-side) VSS conductors or (front-side) VSS lines.

As discussed above, the metal conductor 506-5 is electrically coupled to the reference voltage VSS. The metal conductors 510-1 and 510-5 are electrically connected to the metal conductor 506-5 to serve as a power mesh line for connecting the reference voltage VSS to the metal conductor 506-5. In some embodiments, the metal conductors 510-1 and 510-5 lengthwise overlap the boundaries CB1 in the top view, as shown in FIG. 5A. As shown in FIGS. 5A to 5J, in the SRAM cell 100A, the metal conductors 510-1 and 510-5 are electrically connected to the metal conductor 506-5 through the via 508-2 and the via 508-3, respectively. In some embodiments, the metal conductors 510-1 and 510-5 may be referred to as (front-side) VSS power mesh lines or (front-side) VSS power mesh conductors.

In some embodiments, the metal conductor 506-2 serves as VDD line that is electrically coupled to a voltage source (not shown) (e.g., the supply voltage VDD discussed above) and electrically connected to the source/drain features of the write-port PU transistors. As shown in FIGS. 5A to 5J, in the SRAM cell 100A, the metal conductor 506-2 is over the write-port PU transistors W_PU1 and W_PU2. The metal conductor 506-2 is electrically connected to the source/drain feature 412P shared by the write-port PU transistors W_PU1 and W_PU2 through the via 504-1 and the source/drain contact 430-4. In some embodiments, the metal conductor 506-2 may be referred to as the (front-side) VDD conductors or the (front-side) VDD lines.

In some embodiments, the metal conductors 506-3 and 506-4 are between the metal conductors 506-2 and 506-5. In the top view, as shown in FIG. 5A, the metal conductor 506-3 is across the gate structures 404-3 and 404-4 and the source/drain contact 430-2; and the metal conductor 506-4 is across the gate structures 404-3 and 404-4 and the source/drain contact 430-6. As shown in FIGS. 5A to 5J, in the SRAM cell 100A, the metal conductor 506-3 is electrically connected to the source/drain contact 430-2 (thus also electrically connected to the source/drain feature 412N shared by the write-port PG transistor W_PG1 and the write-port PD transistor W_PD1 and the source/drain feature 412P of the write-port PU transistor W_PU1) through the via 504-2 and the gate structure 404-4 through the gate via 512-3; and the metal conductor 506-4 is electrically connected to the source/drain contact 430-6 (thus also electrically connected to the source/drain feature 412N shared by the write-port PG transistor W_PG2 and the write-port PD transistor W_PD2 and the source/drain feature 412P of the write-port PU transistor W_PU2) through the via 504-3 and the gate structure 404-3 through the gate via 512-4. Since the metal conductor 506-3 is connected to the source/drain contact 208-1 that corresponds to the data node ND and the metal conductor 506-4 is connected to the source/drain contact 208-1 that corresponds to the data node NDB, the metal conductors 506-3 and 506-4 may also be referred to as data node lines or data node conductors.

As discussed above, the back-side interconnection structure is under the device region or at the back-side of the device region. The SRAM cell 100A further includes a back-side interconnection structure 602 including vias 604 (including vias 604-1 to 604-4), metal conductors 606 (including metal conductors 606-1 to 606-5), and an IMD layer 608, which are under (or at the back-side of) the transistors in the SRAM cell 100A (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2).

The metal conductors 606 are in a (back-side) metal layer BML1 in the IMD layer 608 and extend lengthwise in the Y-direction. The metal layer BML1 is under the SRAM cell 100A, and thus the metal conductors 606 are under the transistors (including the source/drain contacts 430, the source/drain features 412N/412P, the nanostructures 410, and gate structures 404) of the SRAM cell 100A.

Each of the vias 604 in the IMD layer 608 are vertically between and electrically connected to the respective source/drain contact 432 and the respective metal conductor 606. In some embodiments, the vias 604 may have a rectangular shape in the top view. In other embodiments, the vias 604 may have a circular shape in the top view.

The vias 604 and the metal conductors 606 may be respectively similar to the via B_V0 and the metal conductors B_M1 discussed above. The vias 604, the metal conductors 606, and IMD layer 608 may also be referred to as back-side vias, back-side metal conductors, and back-side IMD layer, respectively In some embodiments, the metal conductors 606-2 and 606-4 respectively serve as the write bit-line WBL and the write bit-line-bar WBLB discussed above that electrically connected to the source/drain features of the write-port PG transistors. As shown in FIGS. 5A to 5J, in the SRAM cell 100A, the metal conductor 606-2 and 606-4 are under the write-port PG transistors W_PG-1 and W_PG-2. The metal conductor 606-2 is electrically connected to the source/drain feature 412N of the write-port PG transistor W_PG1 through the via 604-1 and the source/drain contact 432-1, and the metal conductor 606-4 is electrically connected to the source/drain feature 412N of the write-port PG transistor W_PG2 through the via 604-3 and the source/drain contact 432-3. In some embodiments, the metal conductors 606-2 and 606-4 may be respectively referred to as (back-side) write bit-line conductor and (back-side) write bit-line-bar conductor.

In some embodiments, the metal conductors 606-1, 606-3, and 606-5 also serve as the VSS line that is electrically coupled to a voltage source (not shown) (e.g., the reference voltage VSS discussed above) and electrically connected to the source/drain features of the write-port PD transistors and the read-port PD transistors. In some embodiments, the metal conductors 606-1 and 606-5 lengthwise overlap the boundaries CB2 in the top view, as shown in FIG. 5B. As shown in FIGS. 5A to 5J, in the SRAM cell 100A, the metal conductors 606-1, 606-3, and 606-5 are under the write-port PD transistors W_PD1 and W_PD2 and the read-port PD transistors R_PD1 and R_PD2. In some embodiments, the metal conductor 606-3 is between the metal conductors 606-2 and 606-4 in the X-direction. The metal conductors 606-3 and 606-5 are electrically connected to the source/drain feature 412N shared by the write-port PD transistor W_PD1 and W_PD2 and the source/drain feature 412N shared by the read-port PD transistors R_PD1 and R_PD2 through the vias 604-2 and 604-4 and the source/drain contact 432-2. Although the metal conductor 606-1 shown in FIGS. 5A to 5J extends in the Y-direction without being connected to other features, it should be noted that the metal conductor 606-1 may be connected to the metal conductors 606-3 and 606-5 serving as the VSS line by other vias and metal conductors at outside area of the SRAM 100A (not shown). In some embodiments, the metal conductors 606-1, 606-3, and 606-5 may also be referred to as (back-side) VSS conductors or (back-side) VSS lines.

The ILD layer 426, the dielectric 428, the ILD layer 514, the IMD 516, and the IMD 608 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The materials of the vias 504, the metal conductors 506, the vias 508, the metal conductors 510, the gate vias 512, the vias 604, and the metal conductors 606 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIGS. 5A to 5J, the metal conductors 606-2 and 606-4 serving as the write bit-line and the write bit-line-bar are more concerned about the resistance, so that the metal conductors 606-2 and 606-4 are disposed at the back-side of the SRAM cell 100A and are designed with wider width to reduce the resistance. This is also means that the crowded space at the front-side interconnection structure in existing technologies are relieved to reduce the routing complexity of the SRAM cells.

Furthermore, all metal conductors 506, 510, and 606 may also be designed with wider width, so that reducing the circuit resistance. The conductor-to-conductor space between the metal conductors 506, 510, and 606 may also be increased to reduce parasitic capacitance. In addition, the metal conductors 506-6 and 506-7 serving as the read bit-lines are more concerned about the capacitance, so that the metal conductors 506-6 and 506-7 are preferred to put in lowest level metallization layer (e.g., the metal layer ML1) for bit-line capacitance reduction.

Furthermore, in a cross sectional view of the SRAM cell 100A, such as FIGS. to 5J, it should be noted that the source/drain contacts 432 are not surrounded by the gate structures 404 in the Y-direction. This means that the current from the back-side conductors, such as the metal conductors 606-2 and 606-4 (which serve as the write the bit-line and the write bit-line-bar) is not affected by the gate structures 404 during operation of the SRAM cell 100A when passing through the source/drain contacts 432. As such, the reliability of the write operations of the SRAM cell 100A is improved. Therefore, the performance of the SRAM cell 100A is improved.

Figure 6A:
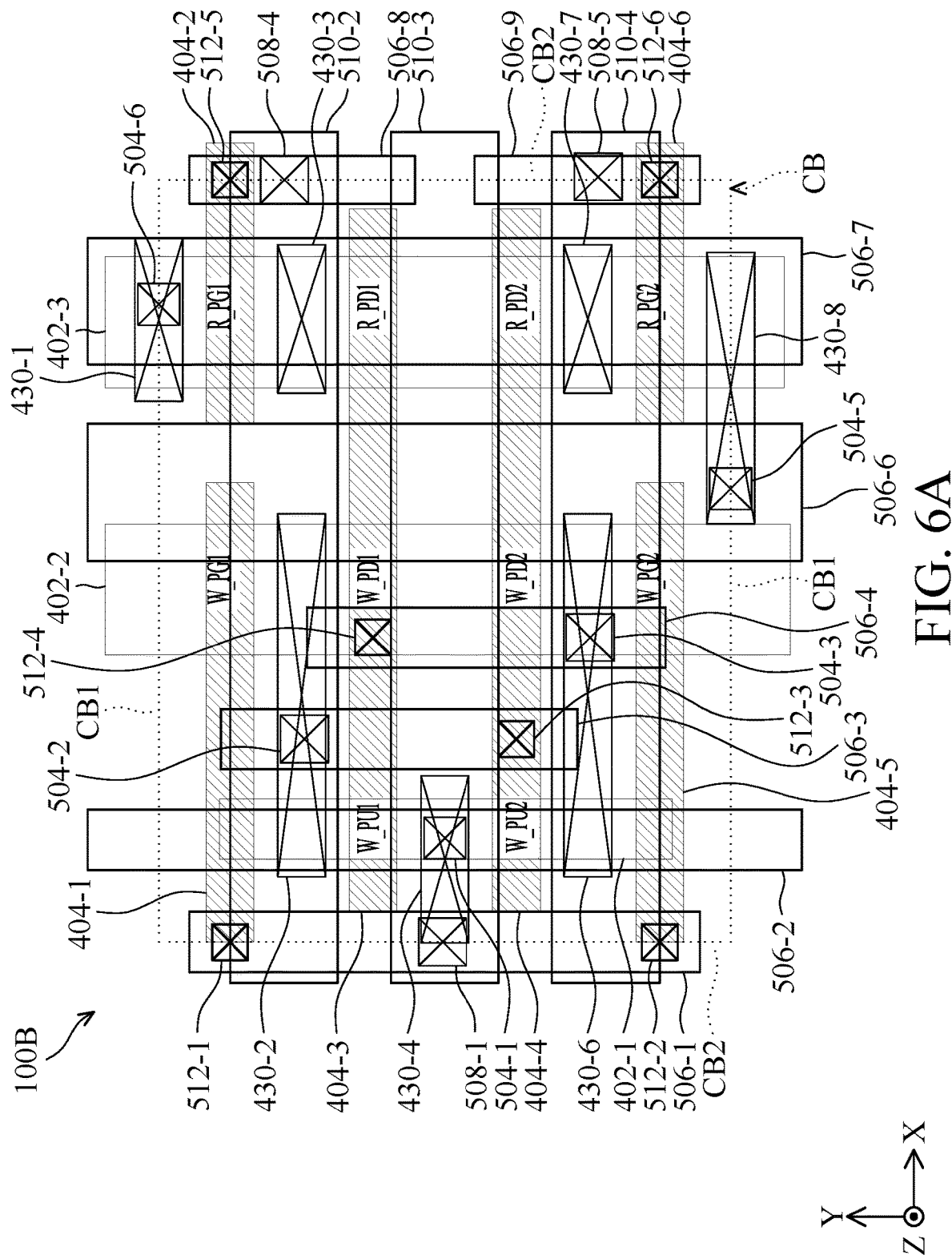
FIGS. 6A and 6B illustrate top views (or layouts) of an SRAM cell that can be one embodiment of the SRAM cell implemented in the memory region, in accordance with some embodiments of the present disclosure.
Figure 6B:
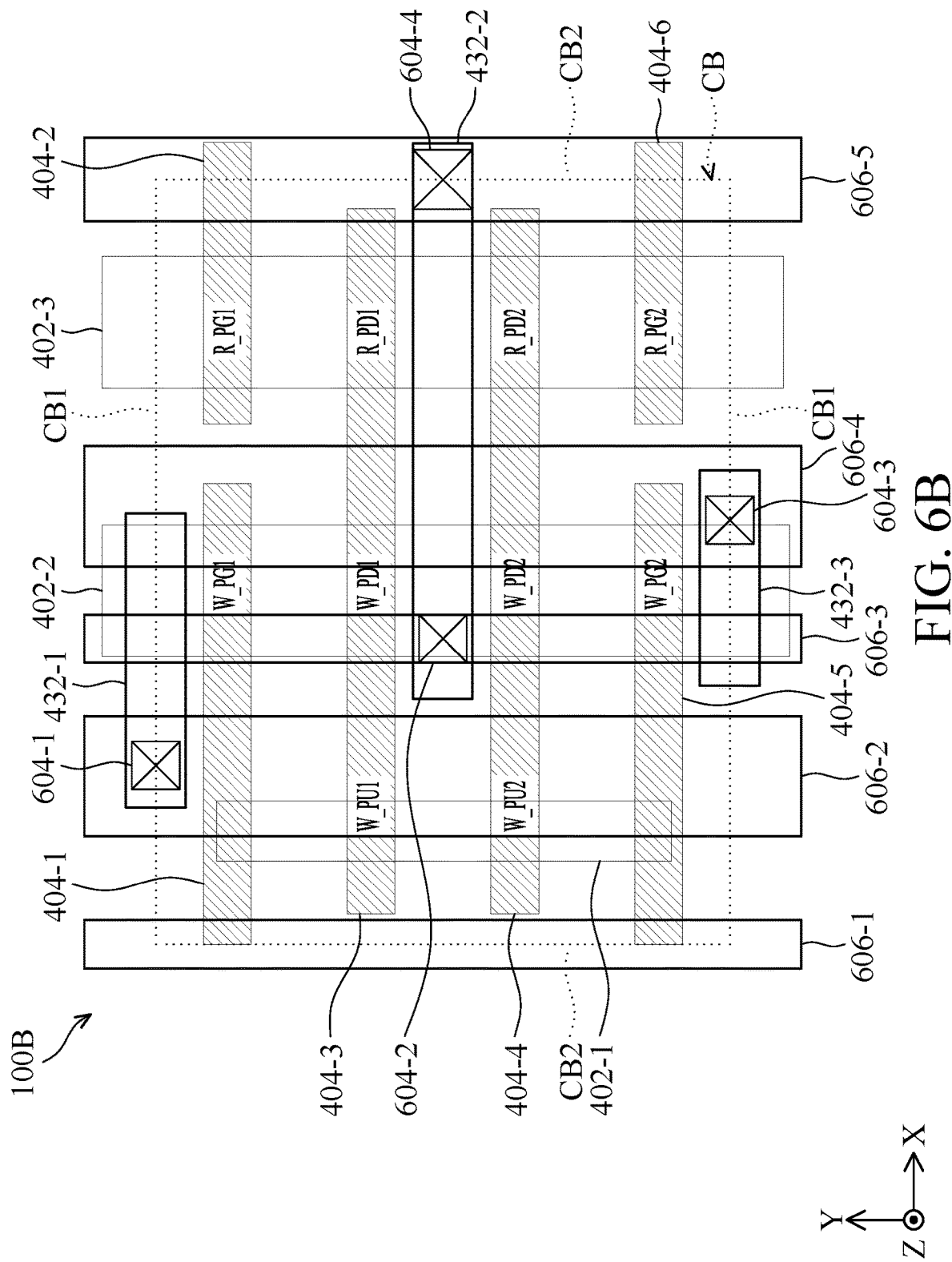

FIGS. 6A and 6B illustrate top views (or layouts) of an SRAM cell 100B that can be one embodiment of the SRAM cell 100 implemented in the memory region 20, in accordance with some embodiments of the present disclosure. FIG. 6A illustrates the features in the device region (including transistors) and the front-side interconnection structure (including vias and metal conductors), and FIG. 6B illustrates the features in the device region and the back-side interconnection structure (including vias and metal conductors).

The SRAM cell 100B is similar to the SRAM cell 100A discussed above, except that the metal conductor 506-5 serving as the VSS line over (or at the front-side of) the transistors in the SRAM cell 100A is omitted. More specifically, the source/drain contact 430-5, the via 504-4, the metal conductor 506-5, the vias 508-2 and 508-3, and the metal conductors 510-1 and 510-5 shown in the SRAM cell 100A are not formed in the SRAM cell 100B. As shown in FIGS. 6A and 6B, the metal conductors 506-6 and 506-7 serving as the read bit-lines may be designed with wider width (in the X-direction) than that in the SRAM cell 100A. As such, the cost of forming the source/drain contact 430-5, the via 504-4, the metal conductor 506-5, the vias 508-2 and 508-3, and the metal conductors 510-1 and 510-5 can be saved and the resistance of the metal conductors 506-6 and 506-7 can be reduced.

Figure 7A:
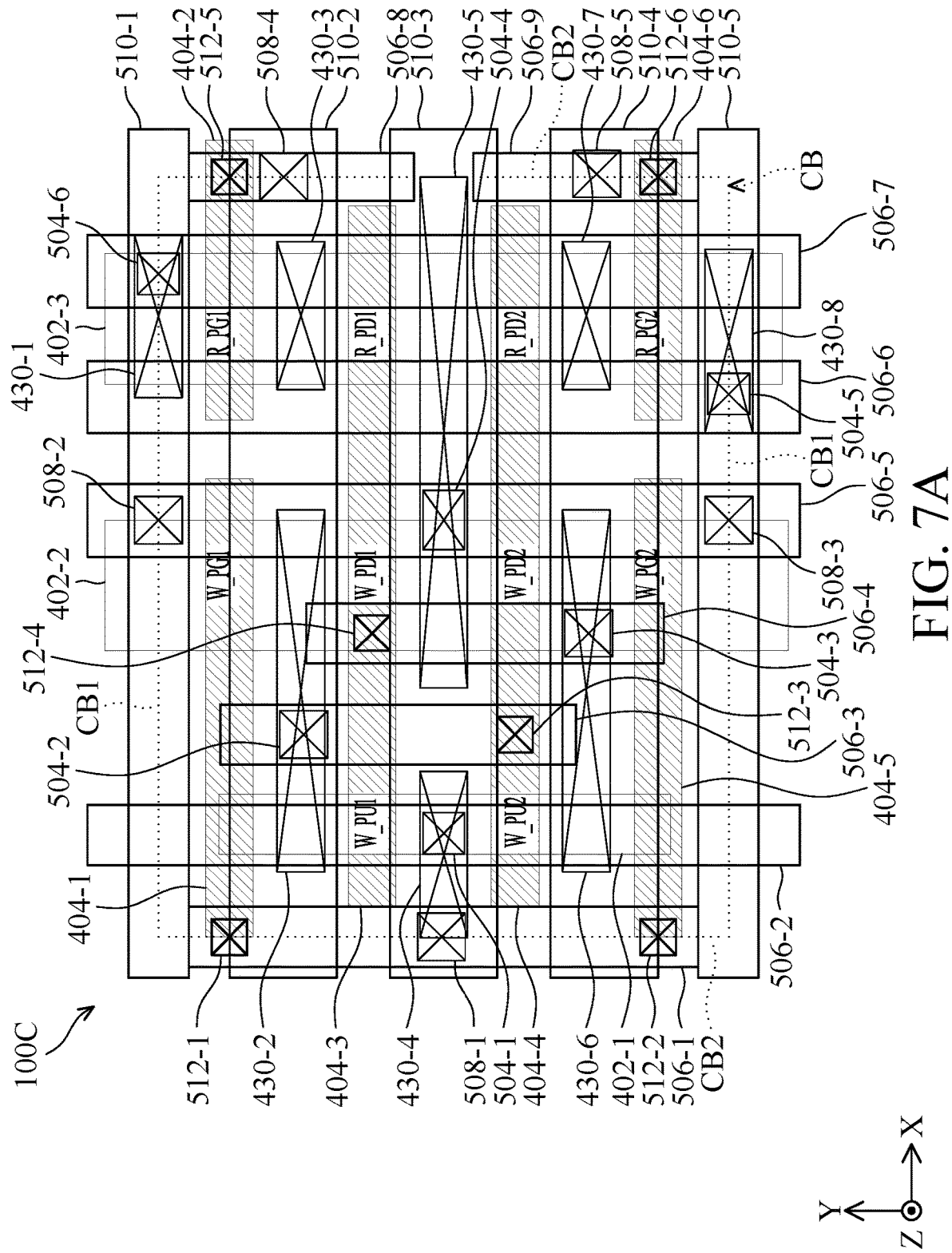
FIGS. 7A and 7B illustrate top views (or layouts) of an SRAM cell that can be one embodiment of the SRAM cell implemented in the memory region, in accordance with some embodiments of the present disclosure.
Figure 7B:
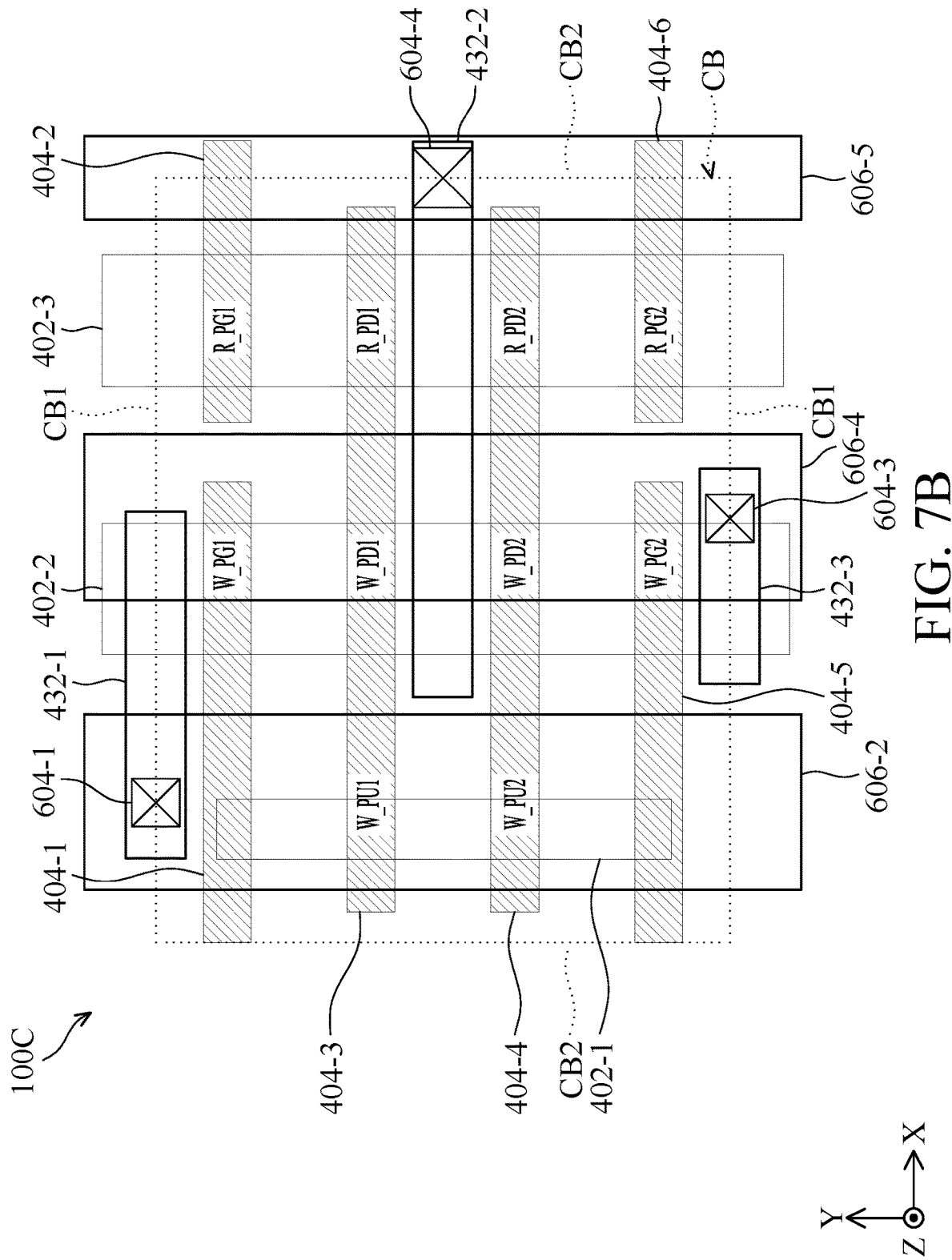

FIGS. 7A and 7B illustrate top views (or layouts) of an SRAM cell 100C that can be one embodiment of the SRAM cell 100 implemented in the memory region 20, in accordance with some embodiments of the present disclosure. FIG. 7A illustrates the features in the device region (including transistors) and the front-side interconnection structure (including vias and metal conductors), and FIG. 7B illustrates the features in the device region and the back-side interconnection structure (including vias and metal conductors).

The SRAM cell 100C is similar to the SRAM cell 100A discussed above, except that the metal conductors 606-1 and 606-3 serving as the VSS lines under (or at the back-side of) the transistors in the SRAM cell 100A are omitted. More specifically, the via 604-2 and the metal conductors 606-1 and 606-3 shown in the SRAM cell 100A are not formed in the SRAM cell 100B. As shown in FIGS. 6A and 6B, the metal conductors 606-2 and 606-4 serving as the write bit-line and the write bit-line-bar may be designed with wider width (in the X-direction) than that in the SRAM cell 100A. As such, the cost of forming the via 604-2 and the metal conductors 606-1 and 606-3 can be saved and the resistance of the metal conductors 606-2 and 606-4 can be reduced. Therefore, it should be noted that the metal conductors 506-5, 606-1, and 606-3 in the SRAM cell 100A are optional. Various combinations of the metal conductors 506-5, 606-1, and 606-3 can be implemented.

Figure 8A:
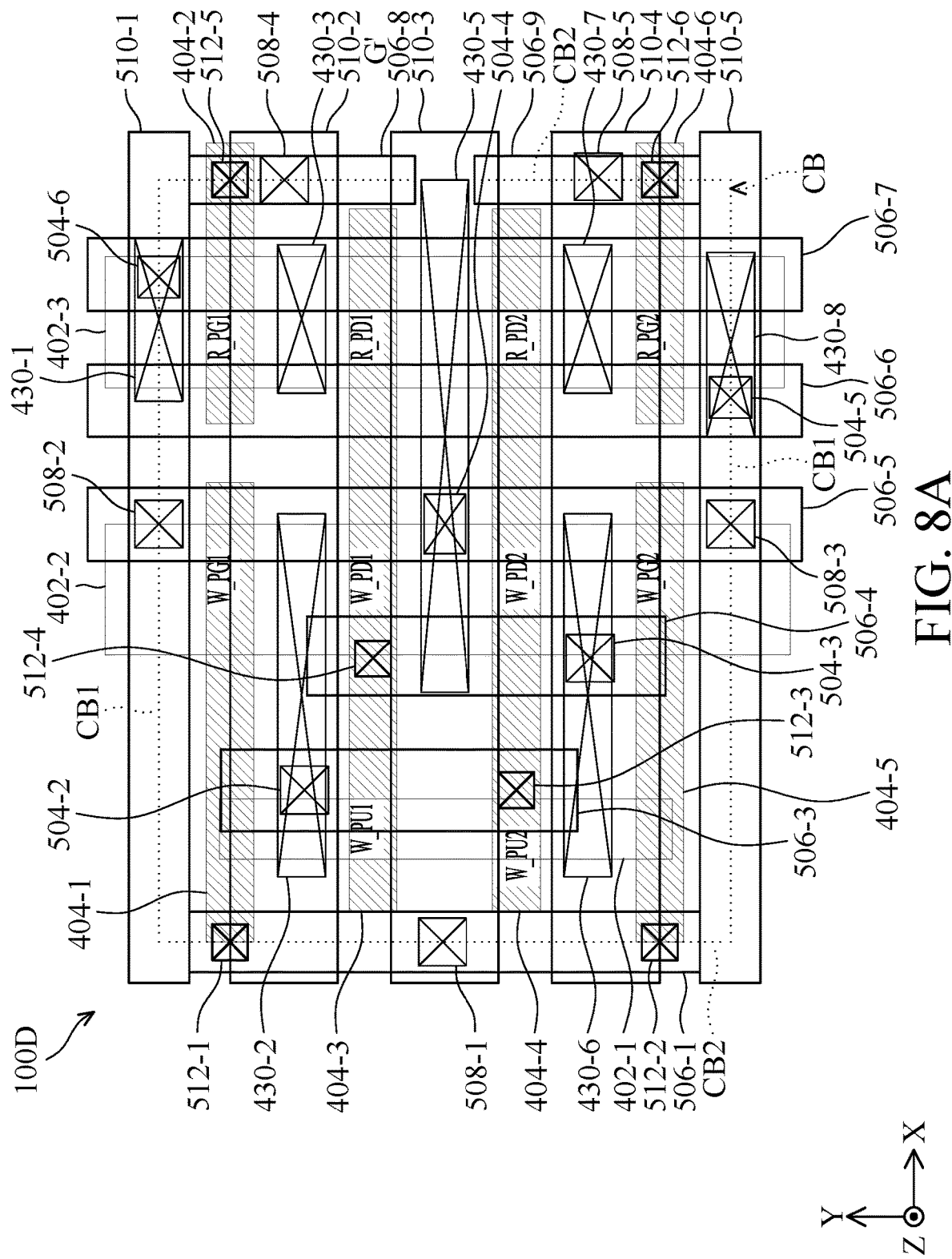
FIGS. 8A and 8B illustrate top views (or layouts) of an SRAM cell that can be one embodiment of the SRAM cell implemented in the memory region, in accordance with some embodiments of the present disclosure.
Figure 8B:
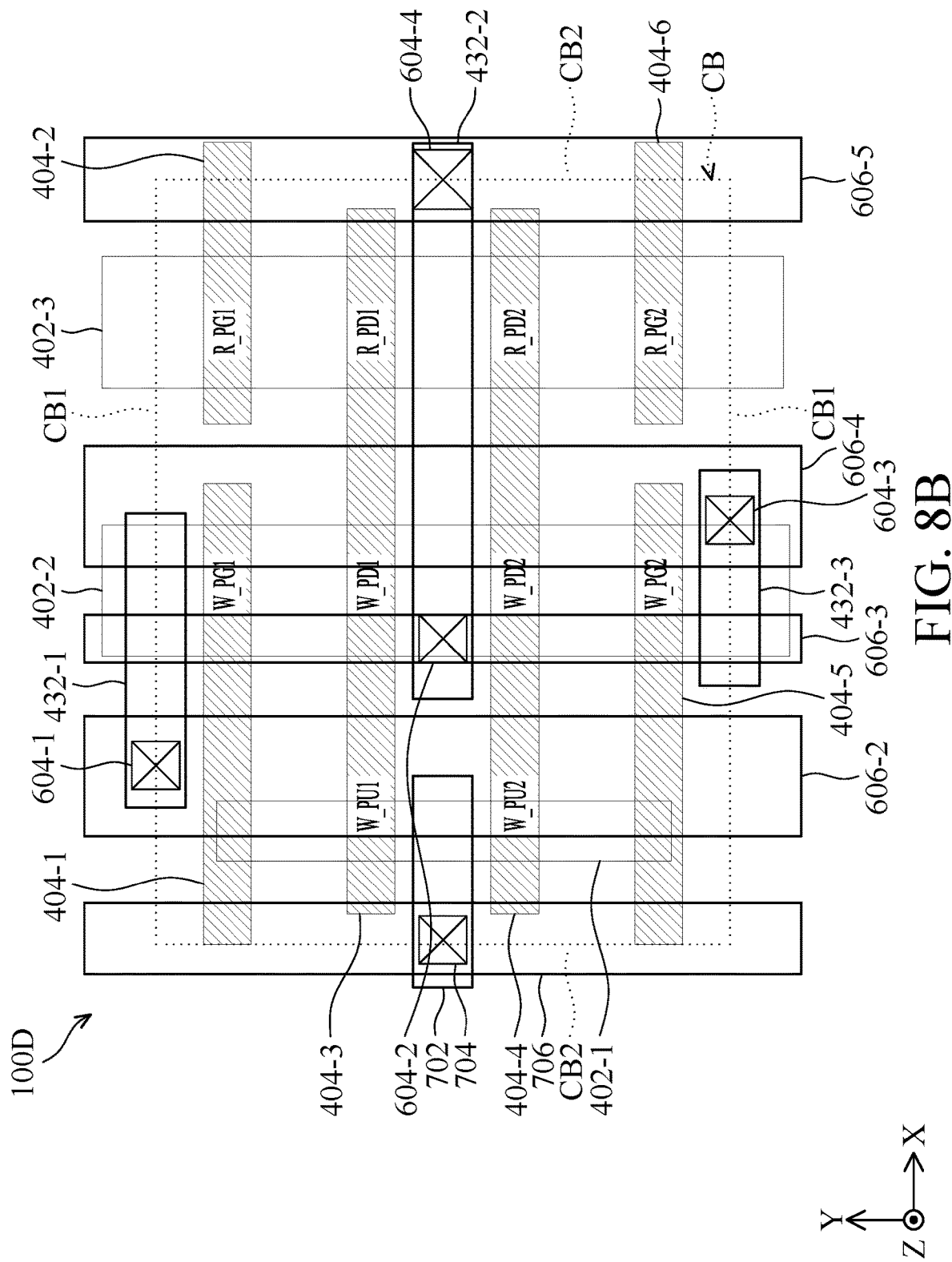

FIGS. 8A and 8B illustrate top views (or layouts) of an SRAM cell 100D that can be one embodiment of the SRAM cell 100 implemented in the memory region 20, in accordance with some embodiments of the present disclosure. FIG. 8A illustrates the features in the device region (including transistors) and the front-side interconnection structure (including vias and metal conductors), and FIG. 8B illustrates the features in the device region and the back-side interconnection structure (including vias and metal conductors).

The SRAM cell 100D is similar to the SRAM cell 100A discussed above, except that the metal conductor serving as VDD line is formed in the metal layer BML1 in the back-side interconnection structure 602. The source/drain contact 430-4, the via 504-1, the metal conductor 506-2, and the metal conductor 606-1 shown in the SRAM cell 101A are not formed in the SRAM cell 100D.

The SRAM cell 100D further includes a source/drain contact 702, a via 704, and a metal conductor 706 in the back-side interconnection structure 602, which are under (or at the back-side of) the transistors in the SRAM cell 100D (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2).

As shown in FIG. 8B, the source/drain contact 702 extends lengthwise in the X-direction. In the top view, the source/drain contact 702 is between the gate structures 404-3 and 404-4 (or between the write-port PU transistors W_PU1 and W_PU2) in the Y-direction. The source/drain contact 702 is under and electrically connected to the source/drain feature 412P shared by the write-port PU transistors W_PU1 and W_PU2. In some embodiments, the source/drain contact 702 may be referred to as back-side source/drain contact due to the source/drain contact 702 is under the source/drain features 412N/412P.

The metal conductor 706 is in the metal layer BML1 in the IMD layer 608 and extends lengthwise in the Y-direction. In some embodiments, the metal conductor 706 lengthwise overlap the boundary CB2 in the top view, as shown in FIG. 8B. The via 704 in the IMD layer 608 is vertically between and electrically connected to the source/drain contact 702 and the metal conductor 706. The vias 704 and the metal conductor 706 may be respectively similar to the vias B_V1 and the metal conductors B_M1 discussed above. The vias 704 and the metal conductor 706 may also be referred to as the back side via, and the back side metal conductor, respectively.

In some embodiments, the metal conductor 706 serves as VDD line that is electrically coupled to a voltage source (not shown) (e.g., the supply voltage VDD discussed above) and electrically connected to the source/drain features of the write-port PU transistors. As shown in FIGS. 8A and 8B, in the SRAM cell 100D, the metal conductor 706 is over the write-port PU transistors W_PU1 and W_PU2. The metal conductor 706 is electrically connected to the source/drain feature 412P shared by the write-port PU transistors W_PU1 and W_PU2 through the via 704 and the source/drain contact 702. In some embodiments, the metal conductor 706 may be referred to as the (back-side) VDD conductors or the (back-side) VDD lines.

Figure 9A:
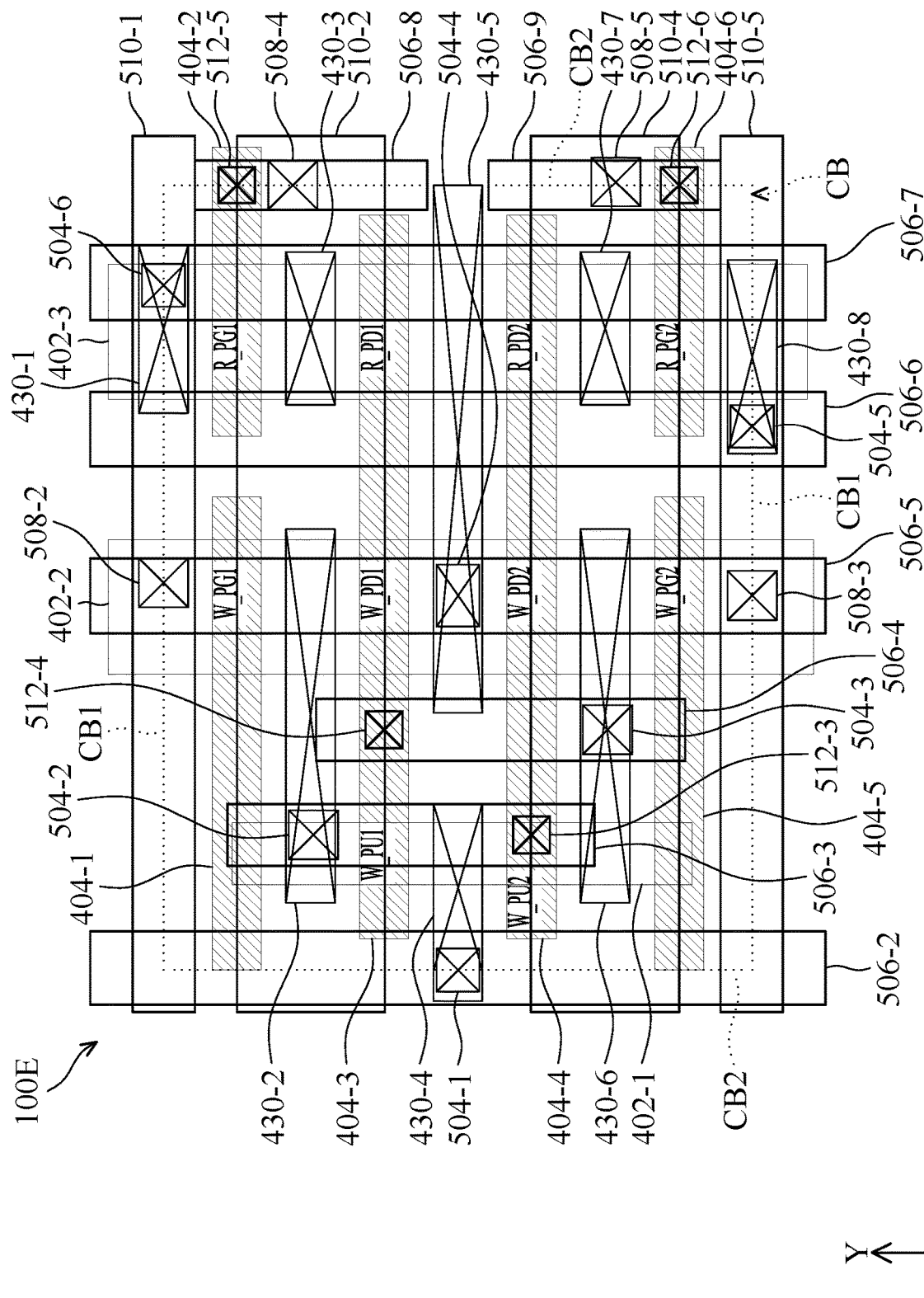
FIGS. 9A and 9B illustrate top views (or layouts) of an SRAM cell that can be one embodiment of the SRAM cell implemented in the memory region, in accordance with some embodiments of the present disclosure.
Figure 9B:
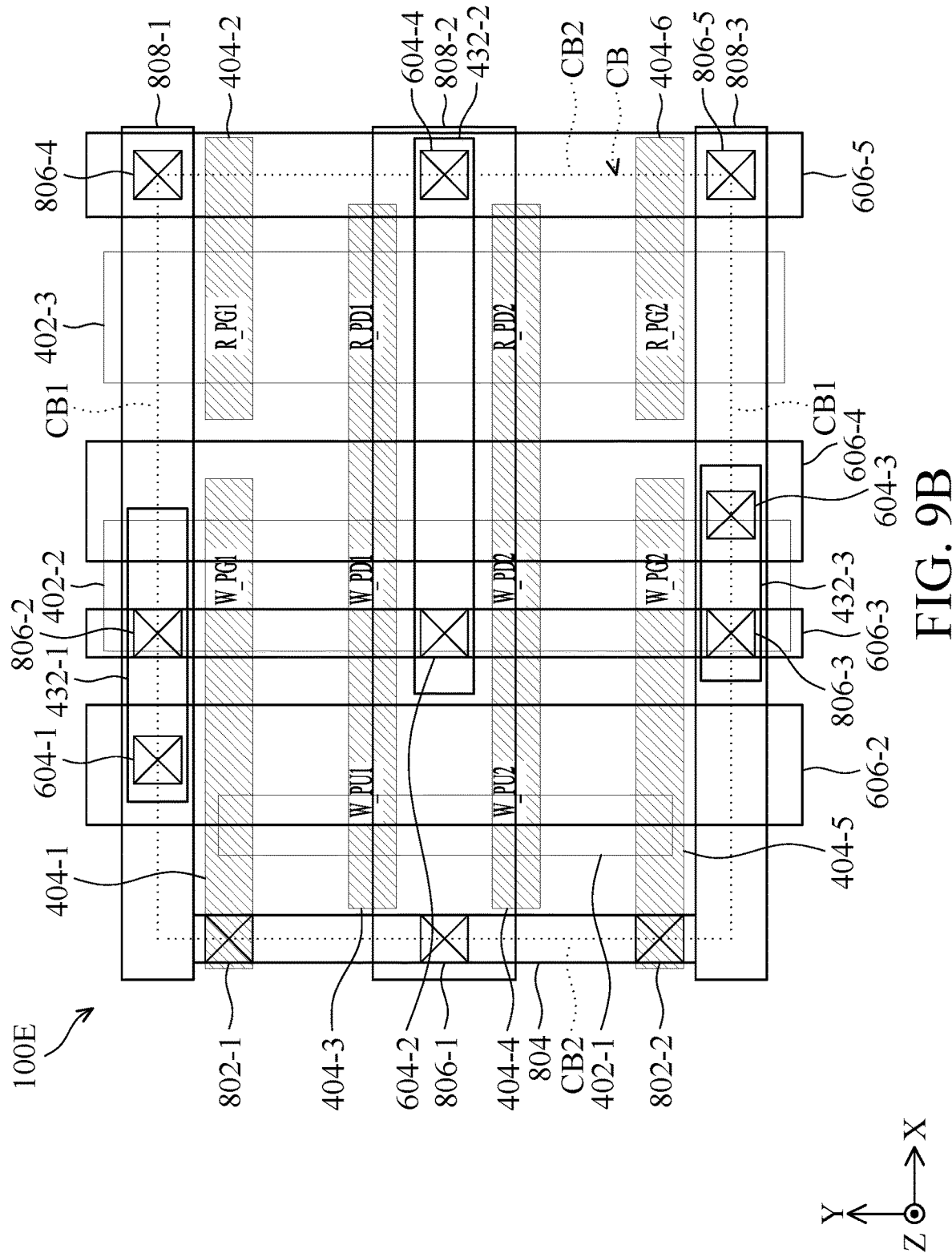

FIGS. 9A and 9B illustrate top views (or layouts) of an SRAM cell 100E that can be one embodiment of the SRAM cell 100 implemented in the memory region 20, in accordance with some embodiments of the present disclosure. FIG. 9A illustrates the features in the device region (including transistors) and the front-side interconnection structure (including vias and metal conductors), and FIG. 9B illustrates the features in the device region and the back-side interconnection structure (including vias and metal conductors).

The SRAM cell 100E is similar to the SRAM cell 100A discussed above, except that the metal conductor serving as write word-line is formed in a metal layer under the metal layer BML1 in the back-side interconnection structure 602. The gate vias 512-1 and 512-2, the via 504-1, the metal conductor 506-1, the via 508-1, the metal conductor 510-3, and the metal conductor 606-1 shown in the SRAM cell 101A are not formed in the SRAM cell 100E. In some embodiments, the metal conductor 506-2 lengthwise overlap the boundary CB1 in the top view, as shown in FIG. 9B.

The SRAM cell 100E further includes gate vias 802 (including gate vias 802-1 and 802-2), a metal conductor 804, vias 806 (including vias 806-1 to 806-4), and metal conductors 808 (including metal conductors 808-1 to 808-3) in the back-side interconnection structure 602, which are under (or at the back-side of) the transistors in the SRAM cell 100E (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2).

The metal conductor 804 is in the metal layer BML1 in the IMD layer 608 and extends lengthwise in the Y-direction. The metal conductors 808 are in a (back-side) metal layer under the metal layer BML1 in the IMD layer 608 and extend lengthwise in the X-direction, and thus the metal conductors 808 are under the metal conductors 606 and 804. Each of the gate vias 802 in the dielectric layer 428 is vertically between and electrically connected to the respective gate structure 404 and the metal conductor 804. Each of the vias 806 in the IMD layer 608 is vertically between and electrically connected to the respective metal conductor 606 and the respective metal conductor 808.

The gate vias 802, the vias 806, the metal conductor 804, and the metal conductors 808 may be respectively similar to the vias B_VG, the vias B_V1, the metal conductors B_M1, and the metal conductors B_M2 discussed above. The gate vias 802, the vias 806, the metal conductor 804, and the metal conductors 808 may also be referred to as the back side gate vias, the back side vias, and the back side metal conductors, respectively.

The metal conductors 808-1 and 808-3 are electrically connected to the metal conductors 606-3 and 606-5 to serve as a power mesh line for connecting the reference voltage VSS to the metal conductors 606-3 and 606-5. In some embodiments, the metal conductors 808-1 and 808-3 lengthwise overlap the boundaries CB1 in the top view, as shown in FIG. 9B. As shown in FIGS. 9A and 9B, in the SRAM cell 100E, the metal conductor 808-1 is electrically connected to the metal conductor 606-3 and 606-5 through the vias 806-2 and 806-4, and the metal conductor 808-3 is electrically connected to the metal conductor 606-3 and 606-5 through the vias 806-3 and 806-5. In some embodiments, the metal conductors 808-1 and 808-3 may be referred to as (back-side) VSS power mesh lines or (back-side) VSS power mesh conductors.

In some embodiments, the metal conductor 808-2 serves as the write word-line WWL discussed above that controls and electrically connected to the gate structures (more specifically, the gate electrodes) of the write-port PG transistors. As shown in FIGS. 9A and 9B, in the SRAM cell 100E, the metal conductor 808-2 is under the write-port PG transistors W_PG1 and W_PG2. The metal conductor 808-2 is between the metal conductors 808-1 and 808-3 in the Y-direction. The metal conductor 808-2 is electrically connected to the gate structure 404-1 of the write-port PG transistor W_PG1 through the via 806-1, the metal conductor 804, and the gate via 802-1, and is electrically connected to the gate structure 404-5 of the write-port PG transistor W_PG2 through the via 806-1, the metal conductor 804, and the gate via 802-2. In some embodiments, the metal conductor 808-2 may be referred to as (back-side) write word-line conductor. In some embodiments, the metal conductor 804 may be referred to as write word-line landing pad. Furthermore, the metal conductor 804 lengthwise overlaps the boundary CB2 in the top view, as shown in FIG. 9B.

As shown in FIGS. 9A and 9B, the metal conductors 510-2 and 510-4 serving as the read word-lines may be designed with wider width (in the X-direction) than that in the SRAM cell 100A due to the metal conductor serving as the write word-line is disposed at the back-side of the SRAM cell 100E to increase the space at the front-side interconnection structure. As such, the metal conductors 510-1 and 510-5 can be saved and the resistance of the metal conductors 510-2 and 510-4 can be reduced.

Figure 10A:
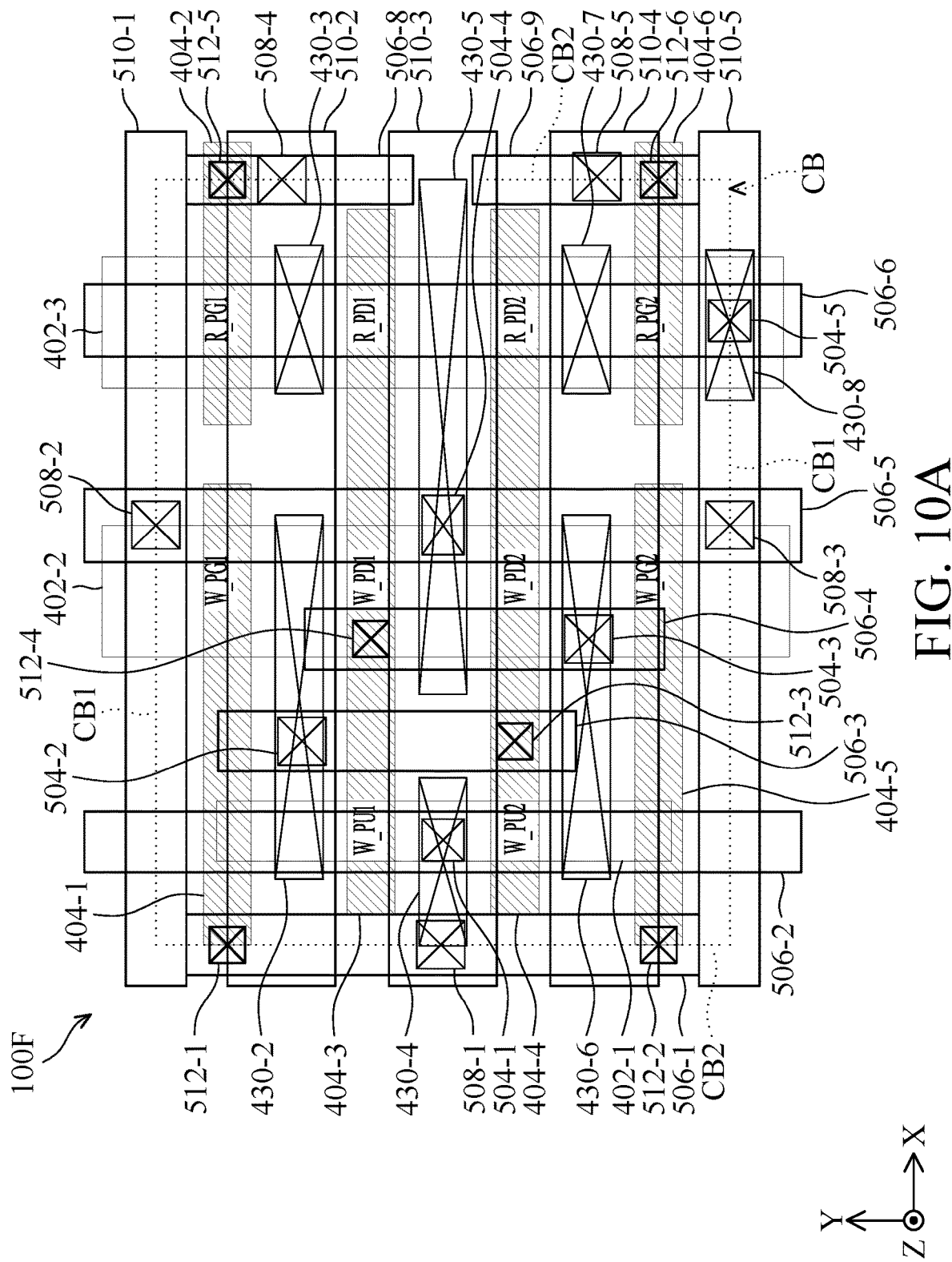
FIGS. 10A and 10B illustrate top views (or layouts) of an SRAM cell that can be one embodiment of the SRAM cell implemented in the memory region, in accordance with some embodiments of the present disclosure.
Figure 10B:
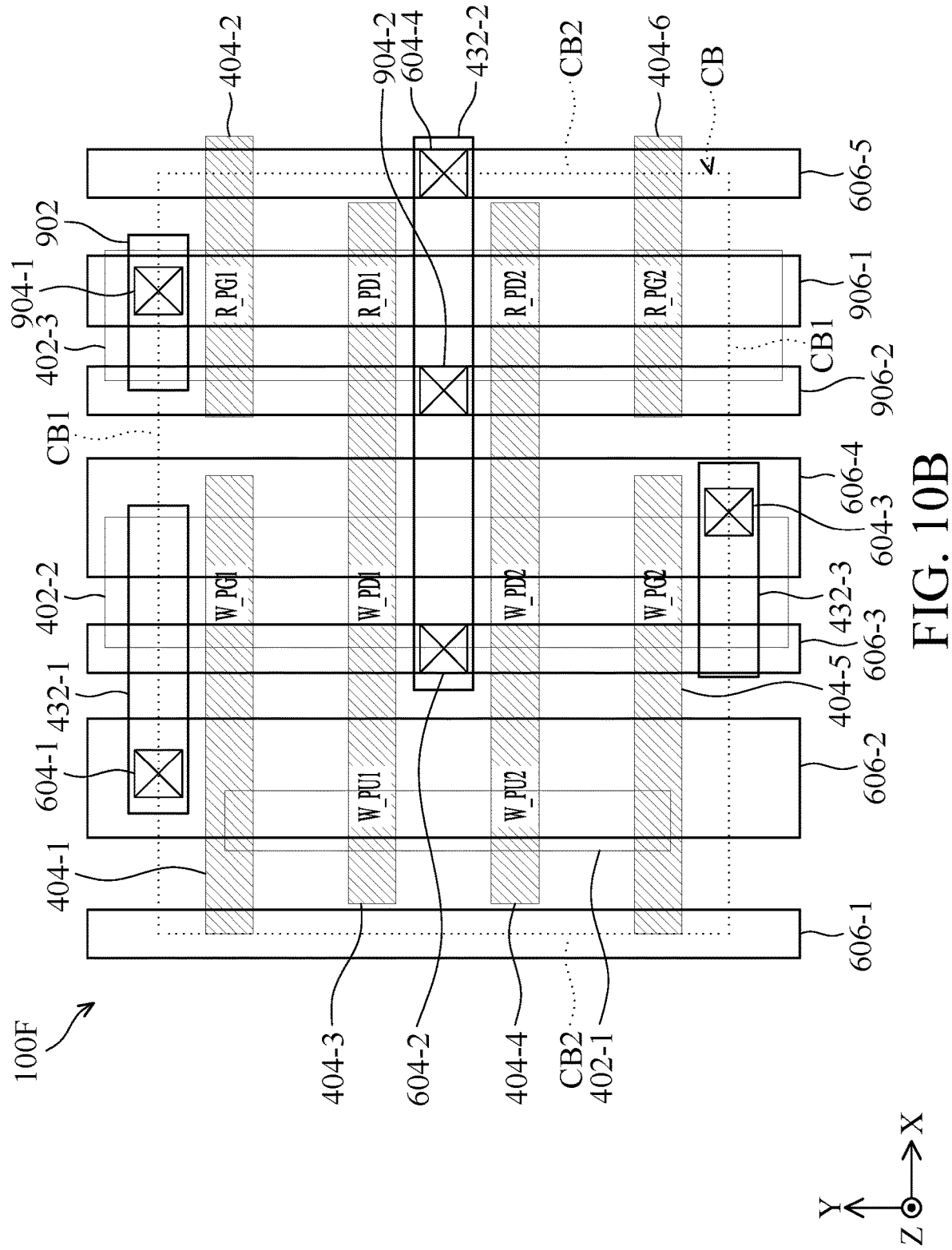

FIGS. 10A and 10B illustrate top views (or layouts) of an SRAM cell 100F that can be one embodiment of the SRAM cell 100 implemented in the memory region 20, in accordance with some embodiments of the present disclosure. FIG. 10A illustrates the features in the device region (including transistors) and the front-side interconnection structure (including vias and metal conductors), and FIG. 10B illustrates the features in the device region and the back-side interconnection structure (including vias and metal conductors).

The SRAM cell 100F is similar to the SRAM cell 100A discussed above, except that one metal conductor serving as read bit-line is formed in the metal layer BML1 in the back-side interconnection structure 602. The source/drain contact 430-1, the via 504-6, and the metal conductor 506-7 shown in the SRAM cell 101A are not formed in the SRAM cell 100F.

The SRAM cell 100F further includes a source/drain contact 902, vias 904 (including vias 904-1 and 904-2), and metal conductors 906 (including metal conductors 906-1 and 906-3) in the back-side interconnection structure 602, which are under (or at the back-side of) the transistors in the SRAM cell 100D (e.g., the write-port PG transistors W_PG1 and W_PG2, the write-port PD transistors W_PD1 and W_PD2, the write-port PU transistors W_PU1 and W_PU2, the read-port PG transistors R_PG1 and R_PG2, and the read-port PD transistors R_PD1 and R_PD2).

As shown in FIG. 10B, the source/drain contact 902 extends lengthwise in the X-direction. In some embodiments, the source/drain contact 902 lengthwise overlaps the boundary CB1 in the top view, as shown in FIG. 10B. The source/drain contact 902 is under and electrically connected to the source/drain feature 412N of the read-port PG transistor R_PG1. In some embodiments, the source/drain contact 902 may be referred to as back-side source/drain contact due to the source/drain contact 902 is under the source/drain features 412N/412P.

The metal conductors 906 are in a (back-side) metal layer BML1 in the IMD layer 608 and extend lengthwise in the Y-direction. The metal layer BML1 is under the SRAM cell 100A, and thus the metal conductors 906 are under the transistors (including the source/drain contacts 430, the source/drain features 412N/412P, the nanostructures 410, and gate structures 404) of the SRAM cell 100F.

Each of the vias 904 in the IMD layer 608 are vertically between and electrically connected to the respective source/drain contact and the respective metal conductor. In some embodiments, the vias 904 may have a rectangular shape in the top view. In other embodiments, the vias 904 may have a circular shape in the top view.

The vias 904 and the metal conductors 906 may be respectively similar to the via B_V0 and the metal conductors B_M1 discussed above. The vias 904 and the metal conductors 906 may also be referred to as back-side vias and back-side metal conductors, respectively In some embodiments, the metal conductor 906-1 serves as the read bit-lines RBL1 discussed above that electrically connected to the source/drain features of the read-port PG transistors. As shown in FIGS. 10A and 10B, in the SRAM cell 100F, the metal conductor 906-1 is under the read-port PG transistors R_PG1 and R_PG2. The metal conductor 906-1 is electrically connected to the source/drain feature 412N of the read-port PG transistor R_PG1 through the via 904-1 and the source/drain contact 902. In some embodiments, the metal conductor 906-1 may be referred to as (front-side) read bit-line conductor.

In some embodiments, the metal conductor 906-2 also serves as the VSS line that is electrically coupled to a voltage source (not shown) (e.g., the reference voltage VSS discussed above) and electrically connected to the source/drain features of the write-port PD transistors and the read-port PD transistors. As shown in FIGS. 10A and 10B, in the SRAM cell 100F, the metal conductor 906-2 is under the write-port PD transistors W_PD1 and W_PD2 and the read-port PD transistors R_PD1 and R_PD2. In some embodiments, the metal conductor 906-2 is between the metal conductors 606-4 and 906-1 in the X-direction. The metal conductor 906-2 is electrically connected to the source/drain feature 412N shared by the write-port PD transistor W_PD1 and W_PD2 and the source/drain feature 412N shared by the read-port PD transistors R_PD1 and R_PD2 through the via 904-2 and the source/drain contact 432-2.

The embodiments disclosed herein relate to memory structures, and more particularly to memory structures comprising the metal conductors for the write bit-line and write bit-line-bar that are under or at the back-side of the SRAM cells (more specifically, functional transistors). Furthermore, the present embodiments provide one or more of the following advantages. The metal conductors for write bit-line and write bit-line-bar at the back-side provides a reduced routing complexity for the SRAM cells, a lower circuit resistance, and a lower parasitic capacitance, which improves the performance of the SRAM cells, such as RC delay.

Thus, one of the embodiments of the present disclosure describes a memory structure that includes a first write-port pull-up (PU) transistor and a second write-port PU transistor arranged in a first direction; a first write-port pull-down (PD) transistor, a second write-port PD transistor, a first write-port pass-gate (PG) transistor, and a second write-port PG transistor arranged in the first direction; and a first read-port PD transistor, a second read-port PD transistor, a first read-port PG transistor, and a second read-port PG transistor arranged in the first direction. The memory structure further includes a first source/drain contact, a second source/drain contact, a write bit-line conductor, and a write bit-line-bar conductor. The first source/drain contact and the second source/drain contact extend in a second direction. The second direction is perpendicular to the first direction. The first source/drain contact is under and electrically connected to a source/drain feature of the first write-port PG transistor. The second source/drain contact is under and electrically connected to a source/drain feature of the second write-port PG transistor. The write bit-line conductor and the write bit-line-bar conductor extend in the first direction. The write bit-line conductor is under and electrically connected to the first source/drain contact. The write bit-line-bar conductor is under and electrically connected to the second source/drain contact.

In some embodiments, the memory structure further includes a VSS conductor extending in the first direction. The VSS conductor is under and electrically connected to a source/drain feature shared by the first write-port PD transistor and the second write-port PD transistor and a source/drain feature shared by the first read-port PD transistor and the second read-port PD transistor.

In some embodiments, the VSS conductor is between the write bit-line conductor and the write bit-line-bar conductor.

In some embodiments, the memory structure further includes a first read bit-line conductor and a second read bit-line conductor extending in the first direction. The first read bit-line conductor is over and electrically connected to a source/drain feature of the first read-port PG transistor and the second read bit-line conductor is over and electrically connected to a source/drain feature of the second read-port PG transistor.

In some embodiments, the memory structure further includes a first read word-line conductor and a second read word-line conductor extending in the second direction. The first read word-line conductor is over and electrically connected to a gate structure of the first read-port PG transistor and the second read word-line conductor is over and electrically connected to a gate structure of the second read-port PG transistor.

In some embodiments, the memory structure further includes a write word-line conductor extending in the second direction. The write word-line conductor is over and electrically connected to a gate structure of the first write-port PG transistor and a gate structure of the second write-port PG transistor.

In some embodiments, the memory structure further includes a write word-line conductor extending in the second direction. The write word-line conductor is under and electrically connected to a gate structure of the first write-port PG transistor and a gate structure of the second write-port PG transistor.

In some embodiments, the memory structure further includes a VDD conductor extending in the first direction. The VDD conductor is over and electrically connected to a source/drain feature shared by the first write-port PU transistor and the second write-port PU transistor.

In another of the embodiments, discussed is a memory structure including a static random-access memory (SRAM) cell having a cell boundary with a rectangular shape. The SRAM cell includes a first write-port pull-up (PU) transistor and a second write-port PU transistor arranged in a first direction; a first write-port pull-down (PD) transistor, a second write-port PD transistor, a first write-port pass-gate (PG) transistor, and a second write-port PG transistor arranged in the first direction; and a first read-port PD transistor, a second read-port PD transistor, a first read-port PG transistor, and a second read-port PG transistor arranged in the first direction. The memory structure further includes a first metal layer under the SRAM cell. The first metal layer includes a write bit-line conductor and a write bit-line-bar conductor extending in the first direction and arranged in a second direction perpendicular to the first direction. The write bit-line conductor is electrically connected to a source/drain feature of the first write-port pass-gate transistor and the write bit-line-bar conductor is electrically connected to a source/drain feature of the second write-port pass-gate transistor.

In some embodiments, the cell boundary comprises a first boundary in the first direction and a second boundary in the second direction, wherein a ratio of a length of the second boundary to a length of the first boundary is in a range from about 1 to about 1.5.

In some embodiments, the first metal layer further includes a first VSS conductor lengthwise overlapping the first boundary in a top view and electrically connected to a source/drain feature shared by the first write-port PD transistor and the second write-port PD transistor and a source/drain feature shared by the first read-port PD transistor and the second read-port PD transistor.

In some embodiments, the memory structure further includes a second metal layer over the SRAM cell. The second metal layer comprises a second VSS conductor extending in the first direction and electrically connected to the source/drain feature shared by the first write-port PD transistor and the second write-port PD transistor and the source/drain feature shared by the first read-port PD transistor and the second read-port PD transistor.

In some embodiments, the memory structure further includes a third metal layer over the second metal layer. The third metal layer comprises a first read word-line conductor and a second read word-line conductor extending in the second direction. The first read word-line conductor is electrically connected to a gate structure of the first read-port PG transistor and the second read word-line conductor is electrically connected to a gate structure of the second read-port PG transistor.

In some embodiments, the second metal layer further includes a first read word-line landing pad and a second read word-line landing pad lengthwise overlapping the first boundary in the top view. The first read word-line conductor is electrically connected to the gate structure of the first read-port PG transistor through the first read word-line landing pad and the second read word-line conductor is electrically connected to the gate structure of the second read-port PG transistor through the second read word-line landing pad.

In some embodiments, the first metal layer further includes a VDD conductor lengthwise overlapping the first boundary in a top view and electrically connected to a source/drain feature shared by the first write-port PU transistor and the second write-port PU transistor.

In yet another of the embodiments, discussed is a memory structure that includes a static random-access memory (SRAM) cell having a cell boundary. The SRAM cell includes a first write-port pull-up (PU) transistor and a second write-port PU transistor, a first write-port pull-down (PD) transistor, a second write-port PD transistor, a first write-port pass-gate (PG) transistor, a second write-port PG transistor, a first read-port PD transistor, a second read-port PD transistor, a first read-port PG transistor, and a second read-port PG transistor respectively comprising nanostructures that are vertically stacked from each other. The memory structure further includes a write bit-line conductor and a write bit-line-bar conductor in a first metal layer under the SRAM cell. The write bit-line conductor is electrically connected to a source/drain feature of the first write-port pass-gate transistor and the write bit-line-bar conductor is electrically connected to a source/drain feature of the second write-port pass-gate transistor.

In some embodiments, the SRAM cell further includes a cell boundary having a first boundary and a second boundary. The ratio of a length of the first boundary to a length of the second boundary is in a range from about 1 to about 1.5.

In some embodiments, the memory structure further includes a first read bit-line conductor and a second read bit-line conductor in a second metal layer over the SRAM cell. The first read bit-line conductor is electrically connected to a source/drain feature of the first read-port PG transistor and the second read bit-line conductor is electrically connected to a source/drain feature of the second read-port PG transistor.

In some embodiments, the memory structure further includes a write word-line conductor in a third metal layer over the second metal layer. The write word-line conductor is electrically connected to a gate structure of the first write-port PG transistor and a gate structure of the second write-port PG transistor.

In some embodiments, the memory structure further includes a write word-line landing pad in the second metal layer and lengthwise overlapping the second boundary in a top view. The write word-line conductor is electrically connected to the gate structure of the first write-port PG transistor and the gate structure of the second write-port PG transistor through the write word-line landing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure, comprising:
   a first write-port pull-up (PU) transistor and a second write-port PU transistor arranged in a first direction;
   a first write-port pull-down (PD) transistor, a second write-port PD transistor, a first write-port pass-gate (PG) transistor, and a second write-port PG transistor arranged in the first direction;
   a first read-port PD transistor, a second read-port PD transistor, a first read-port PG transistor, and a second read-port PG transistor arranged in the first direction;
   a first source/drain contact extending in a second direction perpendicular to the first direction, wherein the first source/drain contact is under and electrically connected to a source/drain feature of the first write-port PG transistor;
   a second source/drain contact extending in the second direction, wherein the second source/drain contact is under and electrically connected to a source/drain feature of the second write-port PG transistor;
   a write bit-line conductor extending in the first direction, wherein the write bit-line conductor is under and electrically connected to the first source/drain contact; and a write bit-line-bar conductor extending in the first direction, wherein the write bit-line-bar conductor is under and electrically connected to the second source/drain contact.

2. The memory structure of claim 1, further comprising:
a VSS conductor extending in the first direction, wherein the VSS conductor is under and electrically connected to a source/drain feature shared by the first write-port PD transistor and the second write-port PD transistor and a source/drain feature shared by the first read-port PD transistor and the second read-port PD transistor.

3. The memory structure of claim 2, wherein the VSS conductor is between the write bit-line conductor and the write bit-line-bar conductor.

4. The memory structure of claim 1, further comprising:
a first read bit-line conductor and a second read bit-line conductor extending in the first direction, wherein the first read bit-line conductor is over and electrically connected to a source/drain feature of the first read-port PG transistor and the second read bit-line conductor is over and electrically connected to a source/drain feature of the second read-port PG transistor.

5. The memory structure of claim 1, further comprising:
a first read word-line conductor and a second read word-line conductor extending in the second direction, wherein the first read word-line conductor is over and electrically connected to a gate structure of the first read-port PG transistor and the second read word-line conductor is over and electrically connected to a gate structure of the second read-port PG transistor.

6. The memory structure of claim 1, further comprising:
a write word-line conductor extending in the second direction, wherein the write word-line conductor is over and electrically connected to a gate structure of the first write-port PG transistor and a gate structure of the second write-port PG transistor.

7. The memory structure of claim 1, further comprising:
a write word-line conductor extending in the second direction, wherein the write word-line conductor is under and electrically connected to a gate structure of the first write-port PG transistor and a gate structure of the second write-port PG transistor.

8. The memory structure of claim 1, further comprising:
a VDD conductor extending in the first direction, wherein the VDD conductor is over and electrically connected to a source/drain feature shared by the first write-port PU transistor and the second write-port PU transistor.

9. A memory structure, comprising:
a static random-access memory (SRAM) cell having a cell boundary with a rectangular shape, wherein the SRAM cell comprises:
a first write-port pull-up (PU) transistor and a second write-port PU transistor arranged in a first direction;
a first write-port pull-down (PD) transistor, a second write-port PD transistor, a first write-port pass-gate (PG) transistor, and a second write-port PG transistor arranged in the first direction; and
a first read-port PD transistor, a second read-port PD transistor, a first read-port PG transistor, and a second read-port PG transistor arranged in the first direction; and
a first metal layer under the SRAM cell, wherein the first metal layer comprises a write bit-line conductor and a write bit-line-bar conductor extending in the first direction and arranged in a second direction perpendicular to the first direction,
wherein the write bit-line conductor is electrically connected to a source/drain feature of the first write-port pass-gate transistor and the write bit-line-bar conductor is electrically connected to a source/drain feature of the second write-port pass-gate transistor.

10. The memory structure of claim 9, wherein the cell boundary comprises a first boundary in the first direction and a second boundary in the second direction, wherein a ratio of a length of the second boundary to a length of the first boundary is in a range from about 1 to about 1.5.

11. The memory structure of claim 10, wherein the first metal layer further comprises:
a first VS S conductor lengthwise overlapping the first boundary in a top view and electrically connected to a source/drain feature shared by the first write-port PD transistor and the second write-port PD transistor and a source/drain feature shared by the first read-port PD transistor and the second read-port PD transistor.

12. The memory structure of claim 11, further comprising:
a second metal layer over the SRAM cell, wherein the second metal layer comprises a second VSS conductor extending in the first direction and electrically connected to the source/drain feature shared by the first write-port PD transistor and the second write-port PD transistor and the source/drain feature shared by the first read-port PD transistor and the second read-port PD transistor.

13. The memory structure of claim 12, further comprising:
a third metal layer over the second metal layer, wherein the third metal layer comprises a first read word-line conductor and a second read word-line conductor extending in the second direction,
wherein the first read word-line conductor is electrically connected to a gate structure of the first read-port PG transistor and the second read word-line conductor is electrically connected to a gate structure of the second read-port PG transistor.

14. The memory structure of claim 13, wherein the second metal layer further comprises:
a first read word-line landing pad and a second read word-line landing pad lengthwise overlapping the first boundary in the top view, wherein the first read word-line conductor is electrically connected to the gate structure of the first read-port PG transistor through the first read word-line landing pad and the second read word-line conductor is electrically connected to the gate structure of the second read-port PG transistor through the second read word-line landing pad.

15. The memory structure of claim 10, wherein the first metal layer further comprises:
a VDD conductor lengthwise overlapping the first boundary in a top view and electrically connected to a source/drain feature shared by the first write-port PU transistor and the second write-port PU transistor.

16. A memory structure, comprising:
a static random-access memory (SRAM) cell having a cell boundary, wherein the SRAM cell comprises:
a first write-port pull-up (PU) transistor and a second write-port PU transistor, a first write-port pull-down (PD) transistor, a second write-port PD transistor, a first write-port pass-gate (PG) transistor, a second write-port PG transistor, a first read-port PD transistor, a second read-port PD transistor, a first read-port PG transistor, and a second read-port PG transistor respectively comprising nanostructures that are vertically stacked from each other; and a write bit-line conductor and a write bit-line-bar conductor in a first metal layer under the SRAM cell, wherein the write bit-line conductor is electrically connected to a source/drain feature of the first write-port pass-gate transistor and the write bit-line-bar conductor is electrically connected to a source/drain feature of the second write-port pass-gate transistor.

17. The memory structure of claim 16, wherein the SRAM cell further comprises:
a cell boundary having a first boundary and a second boundary, wherein a ratio of a length of the first boundary to a length of the second boundary is in a range from about 1 to about 1.5.

18. The memory structure of claim 16, further comprising:
a first read bit-line conductor and a second read bit-line conductor in a second metal layer over the SRAM cell, wherein the first read bit-line conductor is electrically connected to a source/drain feature of the first read-port PG transistor and the second read bit-line conductor is electrically connected to a source/drain feature of the second read-port PG transistor.

19. The memory structure of claim 18, further comprising:
a write word-line conductor in a third metal layer over the second metal layer, wherein the write word-line conductor is electrically connected to a gate structure of the first write-port PG transistor and a gate structure of the second write-port PG transistor.

20. The memory structure of claim 19, further comprising:
a write word-line landing pad in the second metal layer and lengthwise overlapping the second boundary in a top view, wherein the write word-line conductor is electrically connected to the gate structure of the first write-port PG transistor and the gate structure of the second write-port PG transistor through the write word-line landing pad.

* * * * *